(12) United States Patent
Kurihara et al.

(10) Patent No.: US 9,131,176 B2
(45) Date of Patent: Sep. 8, 2015

(54) DRIVING DEVICE AND SPATIAL INFORMATION DETECTING DEVICE USING THE SAME

(75) Inventors: Fumikazu Kurihara, Nara (JP); Yusuke Hashimoto, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 316 days.

(21) Appl. No.: 13/696,099

(22) PCT Filed: Jun. 13, 2011

(86) PCT No.: PCT/JP2011/063519
§ 371 (c)(1),
(2), (4) Date: Nov. 5, 2012

(87) PCT Pub. No.: WO2011/158796
PCT Pub. Date: Dec. 22, 2011

(65) Prior Publication Data
US 2013/0056618 A1  Mar. 7, 2013

(30) Foreign Application Priority Data
Jun. 14, 2010  (JP) .................... 2010-135413

(51) Int. Cl.
*H01L 27/00* (2006.01)
*H04N 5/372* (2011.01)
(Continued)

(52) U.S. Cl.
CPC .......... *H04N 5/37213* (2013.01); *G01S 7/4865* (2013.01); *G01S 17/89* (2013.01);
(Continued)

(58) Field of Classification Search
CPC ............ H01L 27/148; H01L 27/14806; H01L 27/14812; H01L 27/14818; H01L 27/14825; H01L 27/14831; H01L 27/14837; H01L 27/14843; H01L 27/1485; H01L 27/14856; H04N 5/372; H04N 5/37206; H04N 5/37213; H04N 5/3722; H04N 5/3725; H04N 5/3728
USPC ................. 250/208.1; 348/282, 283, 295–299
See application file for complete search history.

(56) References Cited

U.S. PATENT DOCUMENTS 3,999,082 A * 12/1976 Early .............................. 377/58
4,126,836 A * 11/1978 Carnes et al. ................. 333/165
(Continued)

FOREIGN PATENT DOCUMENTS

JP  07-107240 A  4/1995
JP  2002-010132 A  1/2002
(Continued)

OTHER PUBLICATIONS

International Search Report for corresponding International Application No. PCT/JP2011/063519 mailed Jul. 5, 2011.
(Continued)

*Primary Examiner* — Georgia Y Epps
*Assistant Examiner* — Kevin Wyatt
(74) *Attorney, Agent, or Firm* — Renner, Otto, Boisselle & Sklar, LLP

(57) ABSTRACT

The driving device includes an applied voltage control unit configured to perform a transfer process of controlling a charge-coupled device to transfer electric charges. The applied voltage control unit is configured to switch, in order from a first end to a second end of a line of transfer electrodes of the charge-coupled device, a voltage applied to the transfer electrode from a control voltage for forming a potential well to a reference voltage for eliminating the potential well. The applied voltage control unit includes a control circuit configured to generate a driving signal based on a clock signal, and a driving circuit configured to apply the control voltage and the reference voltage selectively to the transfer electrode in accordance with the driving signal. The control circuit is configured to delay a second driving signal defined by the driving signal associated with one of the adjacent transfer electrodes from a first driving signal defined by the driving signal associated with the other of the adjacent transfer electrodes so as to adjust a phase difference between the first driving signal and the second driving signal to a value corresponding to predetermined time shorter than a period of the clock signal.

9 Claims, 11 Drawing Sheets

(51) Int. Cl.
   *H01L 27/148*    (2006.01)
   *H04N 5/376*    (2011.01)
   *G01S 17/89*    (2006.01)
   *G01S 7/486*    (2006.01)

(52) U.S. Cl.
   CPC ....... *H01L 27/148* (2013.01); *H01L 27/14806* (2013.01); *H01L 27/14856* (2013.01); *H04N 5/372* (2013.01); *H04N 5/3765* (2013.01)

(56) References Cited

U.S. PATENT DOCUMENTS

| | | | |
|---|---|---|---|
| 4,156,818 A * | 5/1979 | Collins et al. | 377/58 |
| 5,757,427 A * | 5/1998 | Miyaguchi | 348/243 |
| 6,999,123 B1 * | 2/2006 | Takahashi | 348/312 |
| 7,034,274 B2 | 4/2006 | Hashimoto et al. | |
| 7,876,422 B2 | 1/2011 | Hashimoto et al. | |
| 8,212,908 B2 | 7/2012 | Nagase et al. | |
| 2004/0195493 A1 | 10/2004 | Hashimoto et al. | |
| 2005/0145773 A1 * | 7/2005 | Hashimoto et al. | 250/203.6 |
| 2007/0146522 A1 * | 6/2007 | Okada et al. | 348/311 |
| 2007/0206423 A1 * | 9/2007 | Segami et al. | 365/185.27 |
| 2008/0029690 A1 * | 2/2008 | Hashimoto et al. | 250/214.1 |
| 2009/0040502 A1 | 2/2009 | Hashimoto et al. | |
| 2009/0096906 A1 | 4/2009 | Senda et al. | |
| 2009/0213261 A1 | 8/2009 | Nagase et al. | |

FOREIGN PATENT DOCUMENTS

| | | |
|---|---|---|
| JP | 2004-309310 A | 11/2004 |
| JP | 2008-135800 A | 6/2008 |
| JP | 2009-206802 A | 9/2009 |

OTHER PUBLICATIONS

PCT/ISA/237 for corresponding International Application No. PCT/JP2011/063519 dated Jul. 5, 2011.

Extended European Search Report for European Application No. 11795701.9 dated Nov. 29, 2013.

* cited by examiner (a)

(b)

DRIVING DEVICE AND SPATIAL INFORMATION DETECTING DEVICE USING THE SAME

TECHNICAL FIELD

The present invention relates to a driving device for a charge-coupled device configured to adjust control voltages applied to electrodes of the charge-coupled device in order to transfer electric charges by use of a potential well formed within a semiconductor layer constituting the charge-coupled device, and a spatial information detecting device using the driving device for controlling the charge-coupled device.

BACKGROUND ART

Generally, a charge-coupled device (CCD) is used in a technical field relating an image sensor, a delay of an analog signal, and a shift register for a digital signal, for example. In such a charge-coupled device, plural electrodes are arranged on a surface of a device formation layer made of a semiconductor. Electric charges are stored in a potential well formed within the device formation layer by applying a control voltage to the electrode. Further, a position and a depth of the potential well can be changed by controlling the control voltages applied to the juxtaposed electrodes. Consequently, it is possible to transfer electric charges from one of the adjacent potential wells to the other.

Further, there has been proposed a technique of enabling sensitivity control of a light receiving element by applying such a charge-coupled device to the light receiving element. For example, document 1 (JP 2004-309310 A) discloses a light receiving element which has the same structure as an MIS element in which an electrode is arranged on an electrically insulating layer on a device formation layer constituted by a semiconductor layer doped with impurities. The electrode and the electrically insulating layer are made of light transmissive materials. When light strikes the device formation layer through the electrode and the electrically insulating layer, electric charges occurs inside the device formation layer.

In addition, the single light receiving element has the plural electrodes. With controlling control voltages applied to the electrodes, the area of the potential well within the surface of the device formation layer can be controlled. For example, the device formation layer has a conductivity type of n-type, and the electric charges are electrons. In this example, when the positive control voltage is applied to the electrode, the potential well accumulating electrons is formed at a part of the device formation layer associated with the electrode.

When the device formation layer receives light while the positive control voltage is applied to the electrode to form the potential well within the device formation layer, part of electrons generated close to the potential well is captured by the potential well and then accumulated in the potential well. The remaining electrons which are not accumulated in the potential well vanish at a deep part of the device formation layer due to recombination.

As mentioned in the above, the electrons are accumulated in the potential well. With changing the area of the potential well within the surface of the device formation layer, it is possible to vary a proportion of the electrons accumulated in the potential well to the electrons generated by light irradiation. In brief, the sensitivity of the light receiving element can be adjusted by varying the area of the potential well.

To control the area of the potential well with regard to the single light receiving element, it is sufficient that the number of the electrodes receiving the control voltages is adjusted. For example, when the single light receiving element has the five electrodes, the sensitivity is maximized by applying the positive control voltages to the respective five electrodes, and the sensitivity is minimized by applying the positive control voltages to no electrodes (the electrons are not accumulated).

In the light receiving element having the aforementioned structure, control of the control voltages to the respective electrodes causes a change in the position and the depth of the potential well. Thus, this light receiving element also functions as the charge-coupled device. In brief, this light receiving element can transfer the electrons (electric charges) accumulated in the potential well. Document 1 discloses a technique of applying the control voltages to the respective electrodes to accumulate electric charges corresponding to an amount of received light and subsequently applying the control voltage to the single electrode to store the electric charges in the potential well. In brief, a period for accumulating electric charges and a period for holding the accumulated electric charges are provided. The numbers of the electrodes to which the control voltages are applied are different in the respective periods.

Further, in a similar manner as the charge-coupled device, electric charges held in the potential well are moved between the potential wells formed adjacent to each other by controlling the control voltages applied to the respective electrodes, and finally are taken out from the light receiving element.

Besides, timings of changing the control voltages applied to the respective electrodes are synchronized with a clock signal used for taking out electric charges from the light receiving element. In brief, a time interval between the timings of changing the control voltages applied to the respective electrodes is an integral multiple of a period of the clock signal.

In the following explanation, it is assumed that electric charges are accumulated in a potential well formed by use of plural electrodes arranged in series and subsequently the accumulated electric charges are held in a potential well formed by use of one electrode.

For example, as shown in FIG. 4($b$), the electric charges 12 are accumulated in the potential well 11 associated with the six electrodes 10A to 10F. Thereafter, as shown in FIG. 4($g$), the electric charges 12 are stored in the potential well 11 associated with the single electrode 10A. FIG. 4($a$) indicates positions of the respective electrodes 10. The respective electrodes 10 are distinguished by use of the reference numerals 10A to 10J. The ten electrodes 10 are used as one unit.

Further, in the instance shown in FIG. 4, the following operation is also performed. In this operation, as shown in FIG. 4($h$), the electric charges 12 are accumulated in the potential well 11 associated with the six electrodes 10C to 10H, and thereafter, as shown in FIG. 4($g$), the electric charges 12 are stored in the potential well 11 associated with the single electrode 10H.

The operation illustrated by FIG. 4($b$) to ($g$) and the operation illustrated by FIG. 4($h$) to ($i$) are the same except directions of movement of the electric charges 12 during transition from a charge accumulation state to a charge holding state are reverse to each other. In brief, these operations are symmetric or complementary to each other.

The following explanation is mainly made to the eight electrodes 10A to 10H of one unit of the electrodes 10 as illustrated in FIG. 4. As mentioned in the above, voltages applied to the respective electrodes 10A to 10H are switched to the control voltages at timings synchronized with the clock signal. Therefore, the control voltages are applied at timings as illustrated in FIG. 13. FIG. 13($a$) shows an operation of a counter of counting the clock signals. FIG. 13(b) illustrates timings indicative of the light projection and the no light projection from a light emitting source to the target space. FIG. 13(c) to (j) show respective voltage variations of the electrodes 10A to 10H. The voltage has two levels, that is, a state (upper levee) in which the control voltage is applied to the electrode 10, and a state (lower level) in which no control voltage is applied to the electrode 10.

As apparent from FIG. 13, the five clock signals are necessary for a transition period T2 in which the electric charges 12 accumulated in the potential well 11 associated with the six electrodes 10A to 10F are moved to the potential well 11 associated with the single electrode 10A. When a unit period has the same length as the eightfold period of the clock signal and a period for holding the electric charges 12 has a length identical to the two periods of the clock signal, an accumulation period for accumulating the electric charges 12 has a length identical to the two periods of the clock signal. Thus, the length of the accumulation periods is one fourth of the unit period.

The electric charges 12 are newly accumulated during a period in which the electric charges 12 accumulated in the potential well 11 associated with the six electrodes 10A to 10F are moved to the potential well 11 associated with the single electrode 10A. However, in this period, it is impossible to accumulate electric charges 12 at high sensitivity. The transition period T2 is constant unless the number of the electrodes 10 is changed. Therefore, a relative proportion of the accumulation period is increased with an increase in the unit period. However, the increase in the unit period may cause such a problem that response performance of the light receiving element is deteriorated.

In the above explanation is made to an instance where the charge-coupled device has a function of the light receiving element defined as the MIS element. However, also in an instance where the charge-coupled device has no function of the light receiving element, the same problem is likely to occur. In brief, with regard to an operation including a process of moving electric charges accumulated in the potential well formed at a region over the plural electrodes to the potential well formed at a region over the fewer electrodes, a proportion of the transition period to the unit period is relatively high. Thus, time necessary for completion of the whole operation may be prolonged with an increase in the transition period, and then an undesired delay may occur.

SUMMARY OF INVENTION

In view of the above insufficiency, the present invention has aimed to propose a driving device which can shorten a transfer time period of electric charges within a charge-coupled device without need for a decrease in a period of a clock signal, and further to propose a spatial information detection device using the driving device.

The first aspect of the driving device in accordance with the present invention is defined as a driving device for controlling a charge-coupled device to transfer electric charges. The charge-coupled device includes a semiconductor layer doped with impurities, an electrically insulating layer formed on/over the semiconductor layer, and a line of transfer electrodes positioned on/over the electrically insulating layer for forming a potential well within the semiconductor layer. The driving device includes a clock generation unit, and an applied voltage control unit. The clock generation unit is configured to output a clock signal. The applied voltage control unit is configured to perform a transfer process of switching a voltage applied to the transfer electrode from a control voltage for forming the potential well to a reference voltage for eliminating the potential well in order from a first end to a second end of the line of the transfer electrodes based on the clock signal. The applied voltage control unit includes a control circuit and a driving circuit. The control circuit is configured to create a driving signal defined as a binary signal having a first value and a second value for each transfer electrode and output the created driving signal. The driving circuit is configured to, upon receiving the driving signal, apply the control voltage to the transfer electrode associated with the received driving signal when the received driving signal has the first value, and apply the reference voltage to the transfer electrode associated with the received driving signal when the received driving signal has the second value. The control circuit is configured to, in the transfer process, delay a second driving signal defined by the driving signal associated with one of the adjacent transfer electrodes from a first driving signal defined by the driving signal associated with the other of the adjacent transfer electrodes so as to adjust a phase difference between the first driving signal and the second driving signal to a value corresponding to predetermined time shorter than a period of the clock signal.

In the second aspect of the driving device in accordance with the present invention, in addition to the first aspect, the charge-coupled device includes a holding electrode positioned on/over the electrically insulating layer for generating, in the semiconductor layer, a potential well serving as a holding region for holding electric charges transferred by the driving device. The holding electrode is positioned adjacent to the second end of the line of the transfer electrodes. The applied voltage control unit is configured to, in the transfer process, switch a voltage applied to the transfer electrode from the control voltage to the reference voltage in order from the first end to the second end of the line of the transfer electrodes based on the clock signal so as to transfer the electric charges to the holding region.

In the third aspect of the driving device in accordance with the present invention, in addition to the first aspect, the charge-coupled device includes first and second holding electrodes positioned on/over the electrically insulating layer for generating, in the semiconductor layer, potential wells each serving as a holding region for holding electric charges transferred by the driving device. The first holding electrode is positioned adjacent to the second end of the line of the transfer electrodes. The second holding electrode is positioned adjacent to the first end of the line of the transfer electrodes. The transfer process includes a first transfer process and a second transfer process. The applied voltage control unit is configured to, in the first transfer process, switch a voltage applied to the transfer electrode from the control voltage to the reference voltage in order from the first end to the second end of the line of the transfer electrodes based on the clock signal so as to transfer the electric charges to the holding region corresponding to the first holding electrode. The applied voltage control unit is configured to, in the second transfer process, switch a voltage applied to the transfer electrode from the control voltage to the reference voltage in order from the second end to the first end of the line of the transfer electrodes based on the clock signal so as to transfer the electric charges to the holding region corresponding to the second holding electrode.

In the fourth aspect of the driving device in accordance with the present invention, in addition to the second aspect or the third aspect, the control circuit is configured to adjust values of the driving signals given to the respective transfer electrodes to the first value simultaneously in response to completion of the transfer process.

In the fifth aspect of the driving device in accordance with the present invention, in addition to any one of the first to fourth aspects, the control circuit is configured to keep the predetermined time constant irrespective of the number of times of output of the driving signal.

In the sixth aspect of the driving device in accordance with the present invention, in addition to any one of the first to fourth aspects, the control circuit is configured to prolong the predetermined time on the basis of the number of times of output of the driving signal.

In the seventh aspect of the driving device in accordance with the present invention, in addition to any one of the first to sixth aspects, the control circuit includes a delay circuit, a synchronization circuit, and a driving signal generation circuit. The delay circuit is configured to generate plural timing signals delayed by the predetermined time. The synchronization circuit is configured to synchronize one of the plural timing signals with the clock signal. The driving signal generation circuit is configured to generate the driving signals for the respective transfer electrodes based on the plural timing signals. The delay circuit includes plural delay elements connected circularly. Each delay element is configured to delay a signal inputted by constant time and output the resultant signal.

In the eighth aspect of the driving device in accordance with the present invention, in addition to any one of the first to sixth aspects, the control circuit includes a phase comparison unit and a timing adjustment unit. The phase comparison unit is configured to measure a phase difference between the first driving signal and the second driving signal. The timing adjustment unit is configured to adjust at least one of a phase of the first driving signal and a phase of the second driving signal such that the phase difference is identical to a predetermined value.

The spatial information detecting device in accordance with the present invention includes a light emitting source, an imaging device, and a processing device. The light emitting source is configured to emit light to a target space. The imaging device is configured to receive light from the target space. The processing device is configured to create information of the target space based on a relation between the light emitted from the light emitting source and the light received by the imaging device. The imaging device includes a charge generation unit and a charge-coupled device. The charge generation unit is configured to generate an amount of electric charges corresponding to intensity of the light from the target space. The charge-coupled device is configured to transfer the electric charges generated by the charge generation unit. The charge-coupled device includes a semiconductor layer doped with impurities, an electrically insulating layer formed on/over the semiconductor layer, and a line of transfer electrodes positioned on/over the electrically insulating layer for forming a potential well within the semiconductor layer. The processing device includes a driving device for controlling the charge-coupled device to transfer the electric charges generated by the charge generation unit. The driving device includes a clock generation unit and an applied voltage control unit. The clock generation unit is configured to output a clock signal. The applied voltage control unit is configured to perform a transfer process of switching a voltage applied to the transfer electrode from a control voltage for forming the potential well to a reference voltage for eliminating the potential well in order from a first end to a second end of the line of the transfer electrodes based on the clock signal. The applied voltage control unit includes a control circuit and a driving circuit. The control circuit is configured to create a driving signal defined as a binary signal having a first value and a second value for each transfer electrode and output the created driving signal. The driving circuit is configured to, upon receiving the driving signal, apply the control voltage to the transfer electrode associated with the received driving signal when the received driving signal has the first value, and apply the reference voltage to the transfer electrode associated with the received driving signal when the received driving signal has the second value. The control circuit is configured to, in the transfer process, delay a second driving signal defined by the driving signal associated with one of the adjacent transfer electrodes with respect to a first driving signal defined by the driving signal associated with the other of the adjacent transfer electrodes so as to adjust a phase difference between the first driving signal and the second driving signal to a value corresponding to predetermined time shorter than a period of the clock signal.

DESCRIPTION OF EMBODIMENTS

Figure 3:
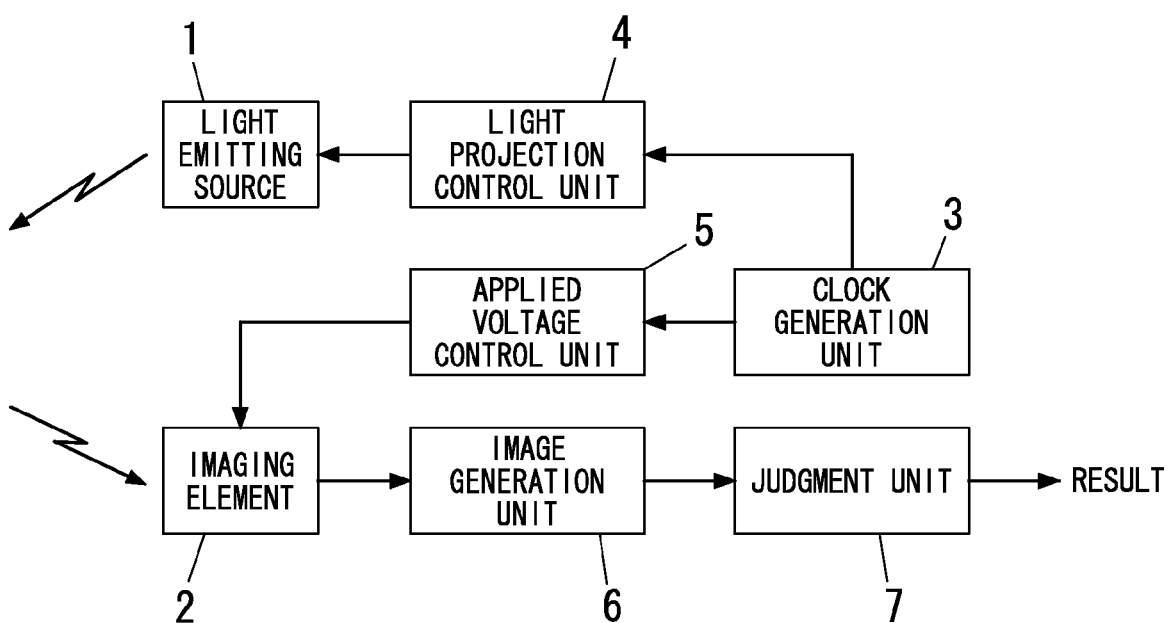
FIG. 3 is a block diagram illustrating an imaging device employing the above driving device.

As shown in FIG. 3, the present embodiment explained below exemplifies an imaging device including a light emitting source 1, and an imaging element 2 configured to receive light from a target space. In FIG. 3, a charge-coupled device is adopted as the imaging element 2. However, the above configuration is merely an example, and does not limit the configuration in association with the present invention.

The light emitting source 1 is constructed by use of one or more light emitting diodes or one or more laser diodes. The light emitting source 1 is driven by a light projection signal generated by a light projection control unit 4. The light projection signal is defined as a signal which indicates light projection or no-light projection of the light emitting source 1 each time a predetermined period based on a period of a clock signal (in the present embodiment, the eightfold period of the clock signal) outputted from a clock generation unit 3 elapses. The light projection signal is generated by frequency dividing of the clock signal by the light projection control unit 4.

Meanwhile, the imaging element 2 images the target space through a light-receiving optical system (e.g., a lens) not shown. A timing at which the imaging element 2 images the target space is controlled by an applied voltage control unit 5. The imaging process is performed in synchronization with the light projection signal in a time period (hereinafter referred to as "light projection period") in which the light emitting source 1 emits light or in a time period (hereinafter referred to as "no light projection period") in which the light emitting source 1 does not emit light. The applied voltage control unit 5 generates a reference timing signal synchronized with the clock signal, and drives the imaging element 2 by use of a control voltage generated based on the reference timing signal. Consequently, the clock generation unit 3 and the applied voltage control unit 5 constitute a driving device for driving the imaging element 2 constituted by the charge-coupled device.

Note that the clock signal is defined as a signal used for all operations of the charge-coupled device such as accumulation of electric charges, movement of electric charges, and read-out of electric charges, in addition to generation of the light projection signal and the reference timing signal. For example, the clock signal is a rectangular wave signal having a frequency of 10 MHz.

An image outputted from the imaging element 2 is a grayscale image having gray values each of which is corresponding to an amount of received light, and is inputted into an image generation unit 6. The image generation unit 6 creates a grayscale image (hereinafter referred to as "grayscale difference image") having pixel values each of which is corresponding to a difference between the gray values of corresponding pixels of the image created during the light projection period by the imaging element 2 and the image created during the no light projection period by the imaging element 2.

The grayscale difference image is a difference image between the image created in the light projection period by the imaging element 2 and the image created in the no light projection period by the imaging element 2. Thus, the pixel value of the grayscale difference image is corresponding to an amount of received reflection light of light emitted from the light emitting source 1 to the target space. Therefore, the grayscale difference image is regarded as a grayscale image with a pixel value obtained by subtracting an outside light component from the pixel value of the grayscale image created in the light projection period. Consequently, an effect of the outside light on information included in the grayscale difference image is reduced, and it is considered that reflection light component of light emitted from the light emitting source 1 is obtained.

The grayscale difference image created by the image generation unit 6 is inputted into a judging unit 7, and is subjected to a desired imaging process by the judgment unit 7. As a result, necessary information is extracted from the grayscale difference image. The imaging process of the judgment unit 7 is properly selected based on information to be extracted. For example, commonly used techniques for checking appearance or shape and for monitoring the target space by use of the grayscale image can be adopted. Thus, no explanation is deemed necessary about the specific configuration of the judging unit 7.

The driving device constituted by the clock generation unit 3 and the applied voltage control unit 5 constitutes a processing device for generating the spatial information in cooperation with the light projection control unit 4, the image generation unit 6, and the judgment unit 7. This processing device constitutes a spatial information detecting device for generating the grayscale difference image and extracting spatial information therefrom in cooperation with the imaging device constituted by the light-receiving optical system and the imaging element 2, and the light emitting source 1.

Figure 2:
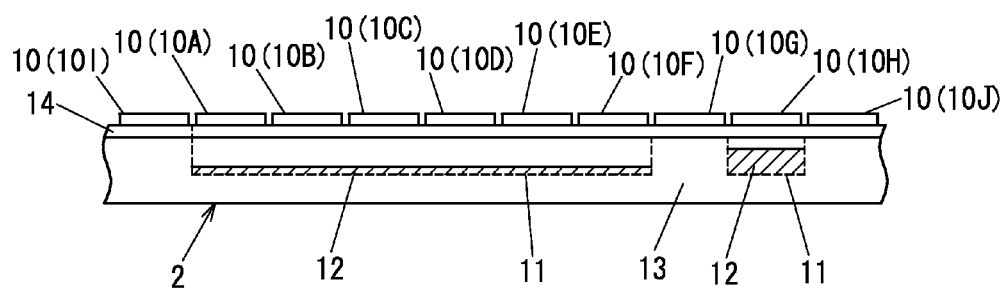
FIG. 2 is a schematic configuration diagram illustrating a charge coupled device.

Note that the imaging element 2 used in the present embodiment, as shown in FIG. 2, has a structure where plural electrodes 10 are arranged on (over) an electrically insulating layer 14 on (over) a device formation layer 13 made of a semiconductor. It is assumed that the imaging element 2 has a structure including an imaging region and an accumulating region in a similar manner as the FT (Frame Transfer) type CCD image sensor. However, for example, the IT (Interline Transfer) type CCD image sensor and the FIT (Frame Interline Transfer) type CCD image sensor can be controlled in a similar manner as the above CCD image sensor.

FIG. 2 shows a configuration corresponding to one pixel of the imaging element 2. The ten electrodes 10 are arranged in a line on the surface of the device formation layer 13. Further, in FIG. 2, in order to distinguish the electrodes 10, the electrodes 10 are designated by respective reference numerals 10A to 10J. Besides, in the operation of the present embodiment, the electrode 10I is positioned adjacent to the electrode 10A. The electrode 10I is used for forming a potential barrier in a light-receiving period, and also is used for moving electric charge in a process of taking out electric charges. Similarly, in the operation of the present embodiment, the electrode 10J is positioned adjacent to the electrode 10H. The electrode 10J is used for forming a potential barrier in the light-receiving period, and also is used for moving electric charge in a process of taking out electric charges.

The imaging element 2 used in the present embodiment includes a region for holding the electric charges corresponding to an amount of received light in the light projection period of the light emitting source 1, and a region for holding the electric charges corresponding to an amount of received light in the no light projection period of the light emitting source 1. In more detail, the potential wells formed in association with the respective electrodes 10A and 10H are used as regions for holding the electric charges collected during the light projection period and the electric charges collected during the no light projection period, respectively. In a process of taking out electric charges from the imaging element 2, the electric charges stored in the respective regions can be taken out at one time. As mentioned above, the potential wells formed in association with the respective electrodes 10A and 10H are used for holding the electric charges. Thus, the electrodes 10A and 10H are referred to as "holding electrodes". In other words, the holding electrodes 10A and 10H are juxtaposed with the plural electrodes 10B to 10G. Further, the potential well formed in association with the holding electrode serves as the holding region for holding the electric charges. According to the above configuration, the imaging element 2 can image the target space in the light projection period and the no light projection period, and can hold the grayscale images of the light projection period and the no light projection period, and can output the grayscale images of the light projection period and the no light projection period to the image generation unit 6 through one read-out process.

As mentioned below, to form the potential well in a part of the device formation layer 13 associated with the electrode 10, the control voltage is applied to the electrode 10. In the following explanation, the control voltage is defined as a voltage which is applied to the electrode 10 for forming a desired potential well. For example, even when the control voltage is not applied to the electrode 10, an appropriate reference voltage is applied to the electrode 10. The control voltage is defined as a voltage different from the reference voltage and is applied to form the potential well within the device formation layer 13. Consequently, no potential well is formed unless the control voltage is applied to the electrode 10. Namely, the control voltage for generating the potential well within the device formation layer (semiconductor layer) 13 and the reference voltage for causing the potential well to vanish is applied to the electrode 10 selectively.

Generally, in a read-out period for taking out the electric charges held by the imaging element 2, the electric charges are transferred in order by controlling the potential wells formed in association with plural electrodes 10 provided to the imaging element 2. Therefore, the read-out period requires a time period much longer than the period of the clock signal. When the grayscale images obtained in the light projection period and the no light projection period are taken out individually, the two read-out periods are necessary to obtain one grayscale difference image by the image generation unit 6. In contrast, according to the configuration of the present embodiment, the grayscale images of the light projection period and the no light projection period are given to the image generation unit 6 through only one read-out period. Therefore, processing time required for obtaining one grayscale difference image can be shortened (the number of the clock signals can be reduced).

A period in which the electric charges are taken out from the imaging element 2 once may include one set of the light projection period and the light projection period. In the present embodiment, plural (e.g., 10000) sets of the light projection period and the no light projection period are included. With providing the plural sets of the light projection period and the no light projection period, it is possible to reduce an effect such as shot noise occurring inside the imaging element 2.

Figure 4:
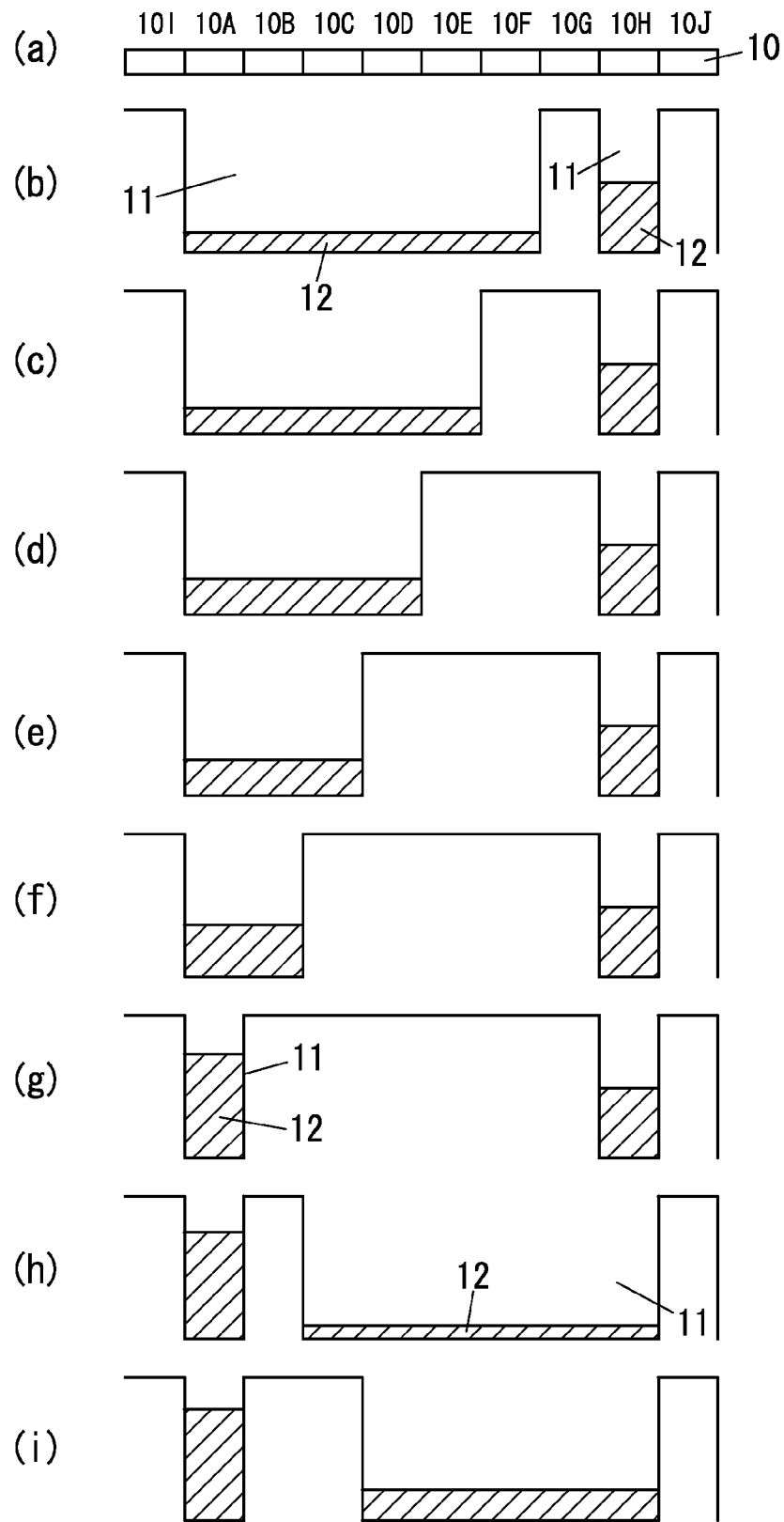
FIG. 4 is an explanation diagram illustrating the operation of the above driving device.

To hold the electric charges of the light projection period and the no light projection period in the imaging element 2, the operation illustrated in FIG. 4 is performed with regard to the one pixel region. FIG. 4(*a*) indicates the arrangement of the electrodes 10. FIG. 4(*b*) to (*i*) illustrate changes of the potential wells. In the present instance, the electric charges corresponding to an amount of received light in the light projection period are stored in the potential well 11 formed in association with the electrode 10A serving as the holding electrode. The electric charges corresponding to an amount of received light in the no light projection period are stored in the potential well 11 formed in association with the electrode 10H serving as the holding electrode.

During the light projection period, as shown in FIG. 4(*b*), the potential well 11 is formed in a region overlapped with the electrodes 10A to 10F. During the no light projection period, as shown in FIG. 4(*h*), the potential well 11 is formed in a region overlapped with the electrodes 10C to 10H. During the light projection period, the electrodes 10B to 10F are used as a line of transfer electrodes, and the electrode 10G is used as a barrier electrode (separation electrode) for forming a potential barrier for separating the potential well associated with the electrodes 10B to 10F from the potential well associated with the single electrode 10H. In contrast, during the light projection period, the electrodes 10C to 10G are used as a line of transfer electrodes, and the electrode 10B is used as a barrier electrode (separation electrode) for forming a potential barrier for separating the potential well associated with the electrodes 10C to 10G from the potential well associated with the single electrode 10A. Besides, a first end of the line of the transfer electrodes is illustrated as a right end in FIG. 2, and a second end of the line of the transfer electrodes is illustrated as a left end in FIG. 2. Therefore, the holding electrode (first holding electrode) 10A is positioned adjacent to the second end of the line of the transfer electrodes 10B to 10F. The holding electrode (second holding electrode) 10H is positioned adjacent to the first end of the line of the transfer electrodes 10C to 10G.

Namely, the electric charges accumulated by use of the electrodes 10B to 10G interposed between the electrodes 10A and 10H serving as the holding electrodes in the light projection period and the no light projection period are held in the respective potential wells formed in association with the electrodes 10A and 10H serving as the holding electrodes. The electric charges generated in response to light striking the device formation layer 13 are accumulated in these potential wells. Therefore, the potential well acts as a photosensitive part for generating the electric charges corresponding to an amount of received light. Consequently, it is considered that the electrodes 10 are positioned on (over) the photosensitive part.

As apparent from the aforementioned operation, it is possible to change the area of the potential well 11 by means of changing the number of the electrodes 10 to which the control voltages are applied. The control voltages applied to the respective electrodes 10 are controlled by the applied voltage control unit 5. Therefore, the area of the potential well 11 is controlled by the applied voltage control unit 5. That is, there are a period in which the area of the potential well 11 is increased such that the potential well functions as the photosensitive part so as to accumulate electric charges, and a period in which the area of the potential well 11 is decreased so as to hold electric charges in the holding region.

To hold, by the potential well 11 serving as the holding region corresponding to the electrode 10A, the electric charges 12 accumulated in the potential well 11 formed in the region overlapped with the electrodes 10A to 10F during the light projection period, the number of the electrodes 10 to which the control voltages are applied is gradually decreased to reduce the area of the potential well 11.

First, as shown in FIG. 4(*b*) to (*h*), the control voltage are applied to all the electrodes 10A to 10F, and subsequently applying the control voltage is terminated in order from the electrode (transfer electrode) 10 farthest from the electrode (holding electrode) 10A. In other words, the applied voltage control unit 5 performs a process (first transfer process) of transferring the electric charges to the holding region (potential well) associated with the holding electrode (first holding electrode) 10A by switching the voltage applied to the transfer electrode 10 from the control voltage to the reference voltage in order from the transfer electrode 10F at the first end of the line of the transfer electrodes 10B to 10F to the transfer electrode 10B at the second end of the line of the transfer electrodes 10B to 10F. According to this operation, the electric charges 12 accumulated in the potential well 11 associated with the electrodes 10A to 10F are stored in the potential well 11 formed in association with the electrodes 10A to 10E, and subsequently are stored in the potential well 11 formed in association with the electrodes 10A to 10D. With repeating such an operation, the electric charges 12 accumulated by the electrodes 10A to 10F during the light projection period are moved towards the potential well 11 formed in association with the electrode 10A, and finally are stored in the potential well 11 formed in association with the electrode 10A. During this operation, the electric charges 12 generated in the no light projection period are stored in the potential well 11 formed in association with the electrode 10H.

Similarly, as shown in FIG. 4(h) to (i), the control voltage are applied to all the electrodes 10C to 10H first, and subsequently applying the control voltage is terminated in order from the electrode (transfer electrode) 10 farthest from the electrode (holding electrode) 10H. In other words, the applied voltage control unit 5 performs a process (second transfer process) of transferring electric charges to the holding region (potential well) associated with the holding electrode (second holding electrode) 10H by switching the voltage applied to the transfer electrode 10 from the control voltage to the reference voltage in order from the transfer electrode 10C at the second end of the line of the transfer electrodes 10C to 10G to the transfer electrode 10G at the first end of the line of the transfer electrodes 10C to 10G. Consequently, the electric charges 12 accumulated by the electrodes 10C to 10H during the no light projection period are moved towards the potential well 11 formed in association with the electrode 10H, and are stored in the potential well 11 formed in association with the electrode 10H. During this operation, the electric charges 12 generated during the light projection period are stored in the potential well 11 formed in association with the electrode 10A.

As apparent from the above, to accumulate the electric charges generated in the light projection period, the area of the potential well is increased in the light projection period to accumulate the electric charges, and the accumulated electric charges are stored in the holding region in the no light projection period. In contrast, to accumulate the electric charges generated in the no light projection period, the area of the potential well is increased in the no light projection period to accumulate the electric charges, and the accumulated electric charges are stored in the holding region in the light projection period.

As mentioned in the above, in the light projection period defined as a first period, to form the potential well 11, the control voltage is applied to each of the electrodes 10A to 10F. The electric charges are accumulated in this potential well 11. Thereafter, to move the electric charges accumulated in the potential well 11 to the holding region associated with the electrode 10A, the area of the potential well 11 is decreased.

In contrast, in the no light projection period defined as a second period, to form the potential well 11, the control voltage is applied to each of the electrodes 10C to 10H. The electric charges are accumulated in this potential well 11. Thereafter, to move the electric charges accumulated in the potential well 11 to the holding region associated with the electrode 10H, the area of the potential well 11 is decreased.

Figure 1:
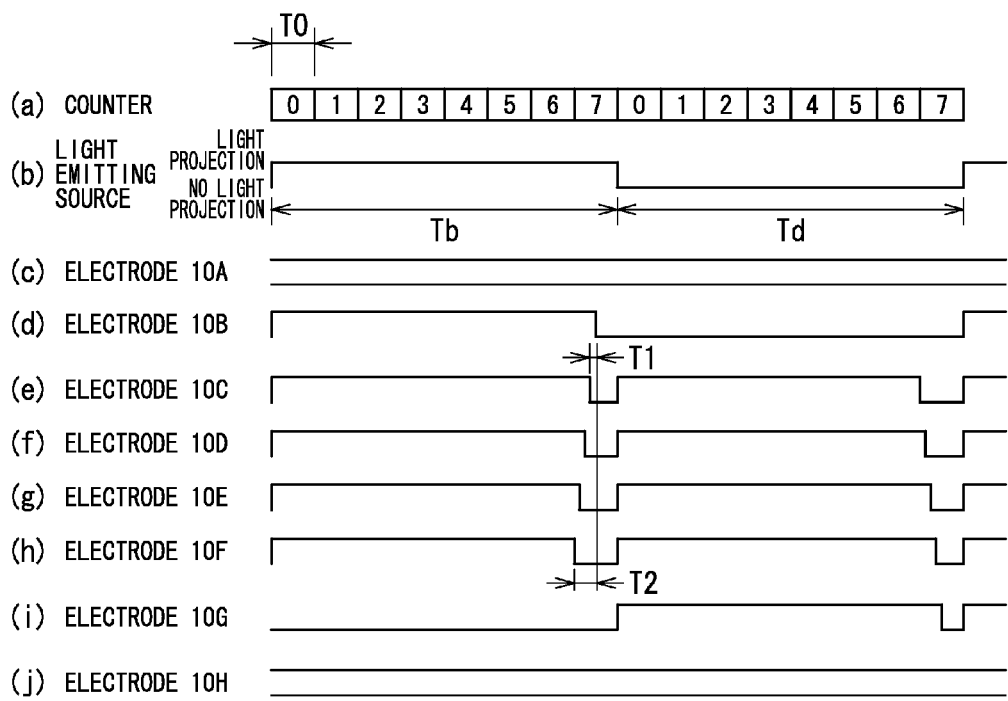
FIG. 1 is an explanation diagram illustrating an operation of the driving device of one embodiment in association with the present invention.

The control voltages are applied to the respective electrodes 10A to 10H at the respective timings illustrated in FIG. 1. FIG. 1(a) shows an operation of a counter designed to count the clock signals. FIG. 1(b) shows timings indicative of the light projection and the no light projection from the light emitting source 1 to the target space. The counter is provided to the light projection control unit 4, and inverts its output each time a predetermined period based on the period of the clock signal (the eightfold period of the clock signal, in the illustrated instance) elapses, thereby generating the light projection signal including the light projection period and the no light projection period which have the same length. However, the light projection period and the no light projection period can have different lengths. The predetermined period is not limited to the eightfold period of the clock signal, but may be selected appropriately.

FIG. 1(c) to (j) shows respective voltage variations of the electrodes 10A to 10H. The voltage of the electrode 10 has two levels. One (upper level) of the two levels indicates a state in which the control voltage is applied to the electrode 10, and the other (lower level) of the two levels indicates a state in which no control voltage is applied to the electrode 10. In other words, the state in which no control voltage is applied to the electrode 10 is considered as a state in which the reference voltage is applied to the electrode 10. A time interval T1 from the change in the control voltage of one of the paired adjacent electrodes 10 of the electrodes 10A to 10F to the change in the control voltage of the other of the paired adjacent electrodes 10 is selected to be shorter than one period T0 of the clock signal. For example, when the clock signal has a frequency of 10 MHz, the time interval T1 may have 1 ns. In the present embodiment, the time interval T1 is constant. Further, the time period T1 is selected such that the total of the time intervals T1 (i.e., a transition period T2) is shorter than the period T0. For example, since the five transfer electrodes 10 are used in the light projection period, the time interval T1 is selected such that 5*T1 is shorter than T0.

According to the above operation, the transition period T2 from a state in which the electric charges 12 are accumulated in the potential well 11 (see FIG. 4) to a state in which the electric charges 12 are held is shorter than one period T0 of the clock signal. The transition period T2 exists in each of the light projection period Tb and the no light projection period Td which have the same length as the eightfold period (8*T0) of the clock signal, and the transition period T2 is shorter than one period T0 of the clock signal. As a result, a most part of each of the light projection period Tb and the no light projection period Td can be used for not movement of the electric charges 12 but accumulation of the electric charges.

As mentioned in the above, a proportion of the transition period T2 to the light projection period Tb and a proportion of the transition period T2 to the no light projection period Td are reduced. Therefore, it is possible to accumulate the electric charges 12 with maximizing the area of the potential well 11 in the most part of the light projection period Tb and the no light projection period Td. That is, it is possible to perform imaging with the high sensibility. Consequently, in contrast to a situation where the time interval T1 for changing the control voltage in the transition period T2 is synchronized with the clock signal, the amount of received light necessary for obtaining the same amount of the electric charges as the above situation may be reduced. Thus, the light projection period Tb and the no light projection period Tb can be shortened.

In the above operation, the time interval T1 for changing the control voltage applied to the electrode 10 is kept constant by the applied voltage control unit 5. Consequently, the time interval T1 between a timing at which applying the control voltage to the electrode 10F is terminated in a state where the control voltages are applied to the respective electrodes 10E and 10F and a timing at which applying the control voltage to the electrode 10E is terminated has the same length as the time interval T1 between a timing at which applying the control voltage to the electrode 10E is terminated in a state where the control voltages are applied to the respective electrodes 10D and 10E and a timing at which applying the control voltage to the electrode 10D is terminated.

Meanwhile, in the operations illustrated in FIGS. 1 and 4, during the time of a transition from a period for holding the electric charges to a period for accumulating the electric charges in the photosensitive part, the control voltages are applied simultaneously to all the electrodes 10 for forming the potential well functioning as the photosensitive part. In other words, during the time of a transition from a period of decreasing the area of the potential well 11 for holding electric charges to a period of increasing the area of the potential well 11 for accumulating electric charges, the control voltages are applied simultaneously to all the necessary electrodes 10. Note that, to facilitate control of the control voltages applied to the respective electrodes 10, the control voltages may be applied to the electrodes in order in the time of the above transition (in the operation explained below, the control voltages are applied to the electrodes in order).

The configuration as explained below can be adopted as an example of the applied voltage control unit 5 configured to apply the control voltages to the respective electrodes 10 at the aforementioned timings. In the configuration illustrated in FIG. 5, a ring oscillator 21 is used to construct the applied voltage control unit 5. The ring oscillator 21 is constituted by the odd number of NOT gates 22 serving as delay elements. In the ring oscillator 21, the NOT gates 22 are connected circularly such that one has an input terminal connected to an output terminal of another. The ring oscillator 21 shows self-oscillation.

As shown in FIG. 6(a) to (d), The NOT gate 22 outputs a rectangular wave signal (e.g., S1 to S4) which is delayed from an input signal to the NOT gate 22 by a time difference identical to the time interval T1 corresponding to delay time of the NOT gate 22. With controlling the control voltages applied to the electrodes 10 by use of the above rectangular wave signals S1 to S4, it is possible to shorten the time interval T1 for changing the control voltages of the respective electrodes 10 than the period of the clock signal. Consequently, the transition period T2 can be shortened.

Besides, it is necessary to synchronize the rectangular wave signals S1 to S4 with the clock signal. Therefore, the rectangular wave signal S4 generated in synchronization with the clock signal by the ring oscillator 21 is compared with the clock signal outputted from the clock generation unit 3 by a phase comparison unit 15. An output from the phase comparison unit 15 is used for adjusting the delay time of each of the NOT gates 22. Consequently, with adjusting time which it takes for a voltage to reach a threshold voltage by controlling a current flowed into the NOT gate 22 based on the output from the phase comparison unit 15, the delay time of the NOT gate 22 is adjusted.

In the illustrated instance, only one part of the outputs of the NOT gates 22 is used. However, the outputs of the remaining NOT gates 22 can be available. With regard to the NOT gates 22 connected to each other, the output of the front NOT gate 22 is inverted and is outputted from the rear NOT gate 22. Therefore, when the output of the front NOT gate 22 falls, the output of the rear NOT gate 22 rises after an elapse of the aforementioned delay time. Note that the output of the rear NOT gate 22 falls after an elapse of the half period of the square wave signal outputted from the ring oscillator 21. With using such a time relation, it is possible to use the outputs of the front NOT gate 22 and the rear NOT gate 22 successfully. In other words, it is possible to use all the outputs of the respective NOT gates 22 for controlling the timings of applying the control voltages to the electrodes 10. Thus, all the NOT gates 22 can be used effectively.

One rectangular wave signal S1 outputted from the ring oscillator 21 is inputted into a reference pulse generation unit 23, and then, as shown in FIG. 6(e), a reference timing signal S5 which has a low level during a period having the same length as one period T0 of the clock signal in the light projection period Tb and the no light projection period Td (see FIG. 6(j)) is generated. To generate the control voltages applied to the respective electrodes 10, the remaining rectangular wave signals S2 to S4 of the ring oscillator 21 and the reference timing signal S5 are inputted into data latches (D flip-flops) 24. The number of the data latches 24 to be provided is corresponding to the number of the electrodes 10 to be controlled. In the present embodiment, since the control voltages are applied to the eight electrodes 10 at the different timings, the eight data latches 24 are necessary.

The reference timing signal S5 is inputted into a data terminal D of the data latch 24, and the corresponding rectangular wave signal (S2 to S4) is inputted into a clock signal of the data latch 24. The data latch 24 is a rising latch, and outputs, from an output terminal Q, an input of the data terminal D at the time of rise in the rectangular wave signal (S2 to S4). Therefore, as shown in FIG. 6(f) to (h), the outputs S6 to S8 of the respective data latches 24 have the same waveform as the reference timing signal S5, and are considered to be delay signals of the reference timing signal S5. The delay time is corresponding to a time difference between the rectangular wave signal S1 and the rectangular wave signal (S2 to S4).

The order of timings of applying the control voltages to the respective electrodes 10 in the light projection period Tb is reverse order of timings of applying the control voltages to the respective electrodes 10 in the no light projection period Td. In view of this, to select an input signal to the clock terminal of the data latch 24 from the rectangular wave signals S2 to S4, a selection signal SEL is generated. The selection signal SEL is defined as a signal which is delayed by appropriate time from the light projection signal (see FIG. 6(j)) defining the light projection period Tb and the no light projection period Td. In other words, necessary two signals of the rectangular wave signals S2 to S4 outputted from the ring oscillator 21 are given to the selector 25 as inputs, and one of the necessary two signals inputted into the selector 25 is selected as an output of the selector 25 based on the selection signal SEL.

Figure 5:
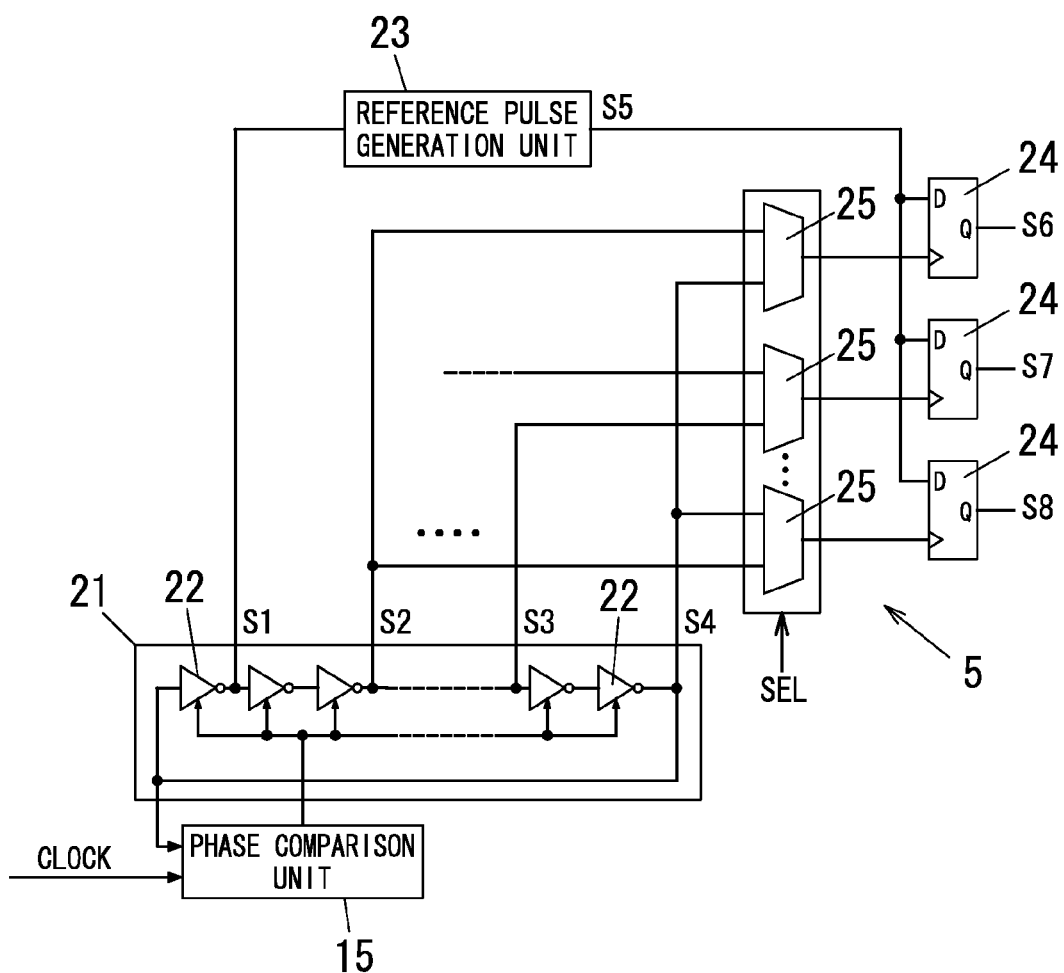
FIG. 5 is a circuit diagram illustrating an instance of the applied voltage control unit of the above driving device.
Figure 6:
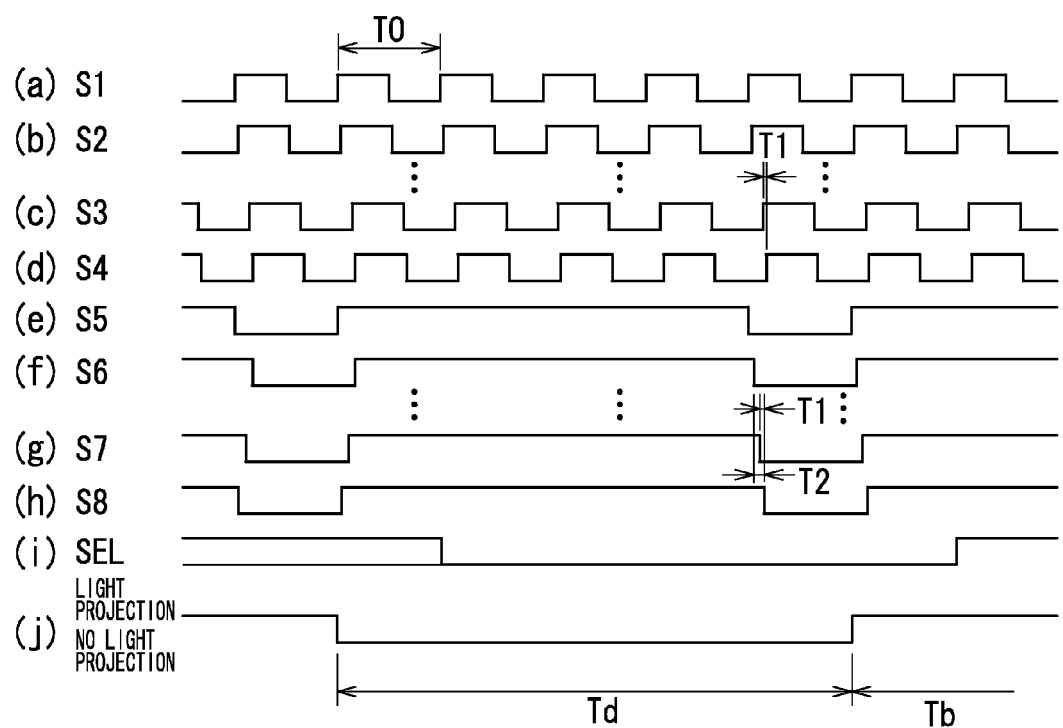
FIG. 6 is an explanation diagram illustrating the operation of the above applied voltage control unit.

For example, the rectangular wave signals S2 and S4 are inputted into the upmost selector 25 in FIG. 5. The rectangular wave signal S2 has the minimum time difference between itself and the rectangular wave signals S1 used for generating the reference timing signal S5. The rectangular wave signal S4 has the maximum time difference between itself and the rectangular wave signal S1. Further, the rectangular wave signal having the second smallest time difference between itself and the rectangular wave signal S1 and the rectangular wave signal having the second greatest time difference between itself and the rectangular wave signal S1 are inputted into the next selector 25. The downmost selector 25 is enabled to select one from the rectangular wave signal S4 and the rectangular wave signal S2. The rectangular wave signal S4 has the maximum time difference between itself and the rectangular wave signal S1. The rectangular wave signal S2 has the minimum time difference between itself and the rectangular wave signals S1.

According to such a combination of inputs to the respective selectors 25, it is possible to change the order of the rectangular wave signals S2 to S4 inputted into the clock terminals of the respective data latches 24 by use of the selection signal SEL. Besides, the same set of the rectangular wave signals S2 and S4 is inputted into each of the upmost selector 25 and the downmost selector 25. However, the connection relation is designed such that the upmost selector 25 and the downmost selector 25 output the different rectangular wave signals S2 and S4. The similar concept is applied to the connection relation of the other selectors 25.

Figure 7:
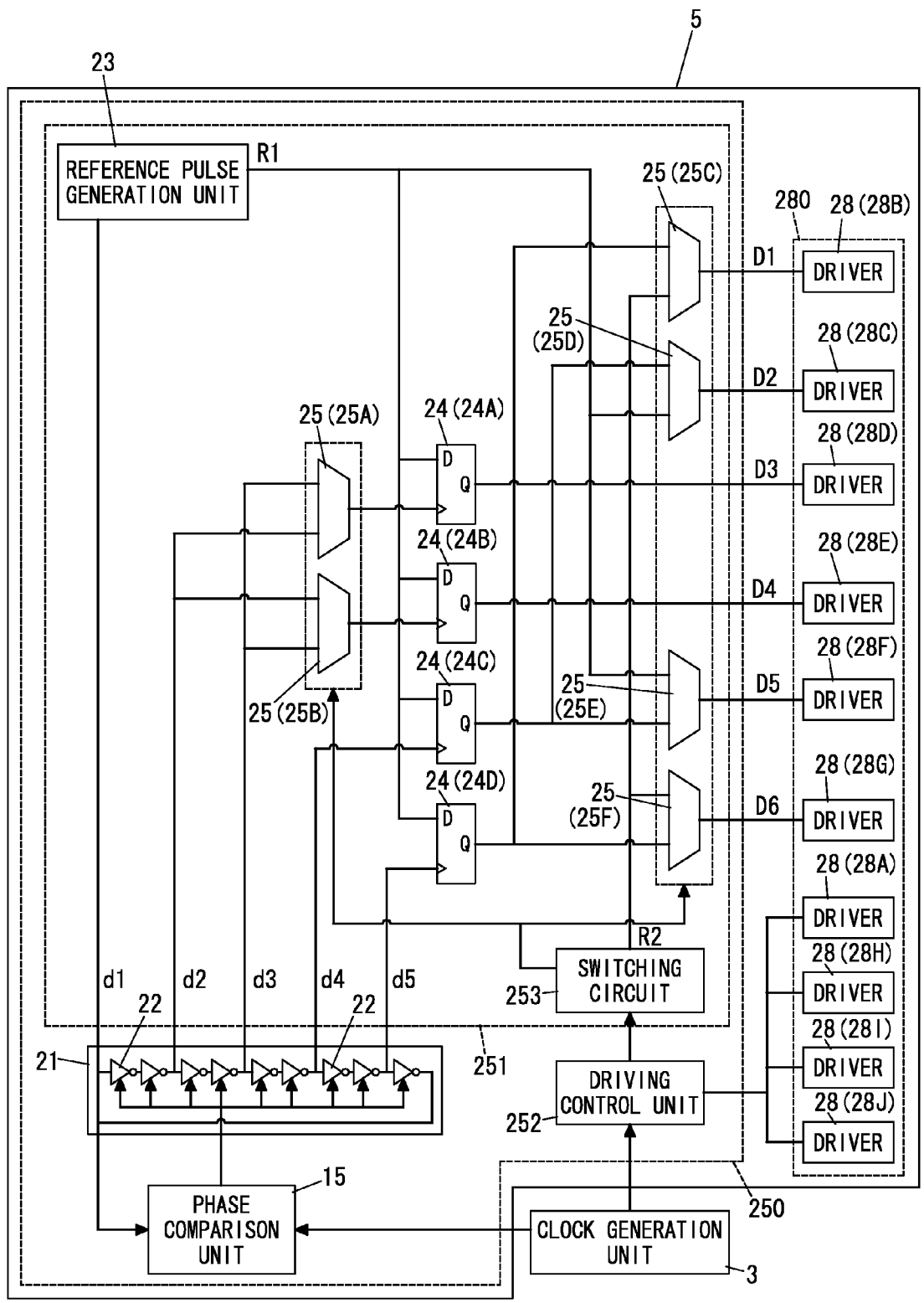
FIG. 7 is a circuit diagram illustrating an instance of the above applied voltage control unit.
Figure 8:
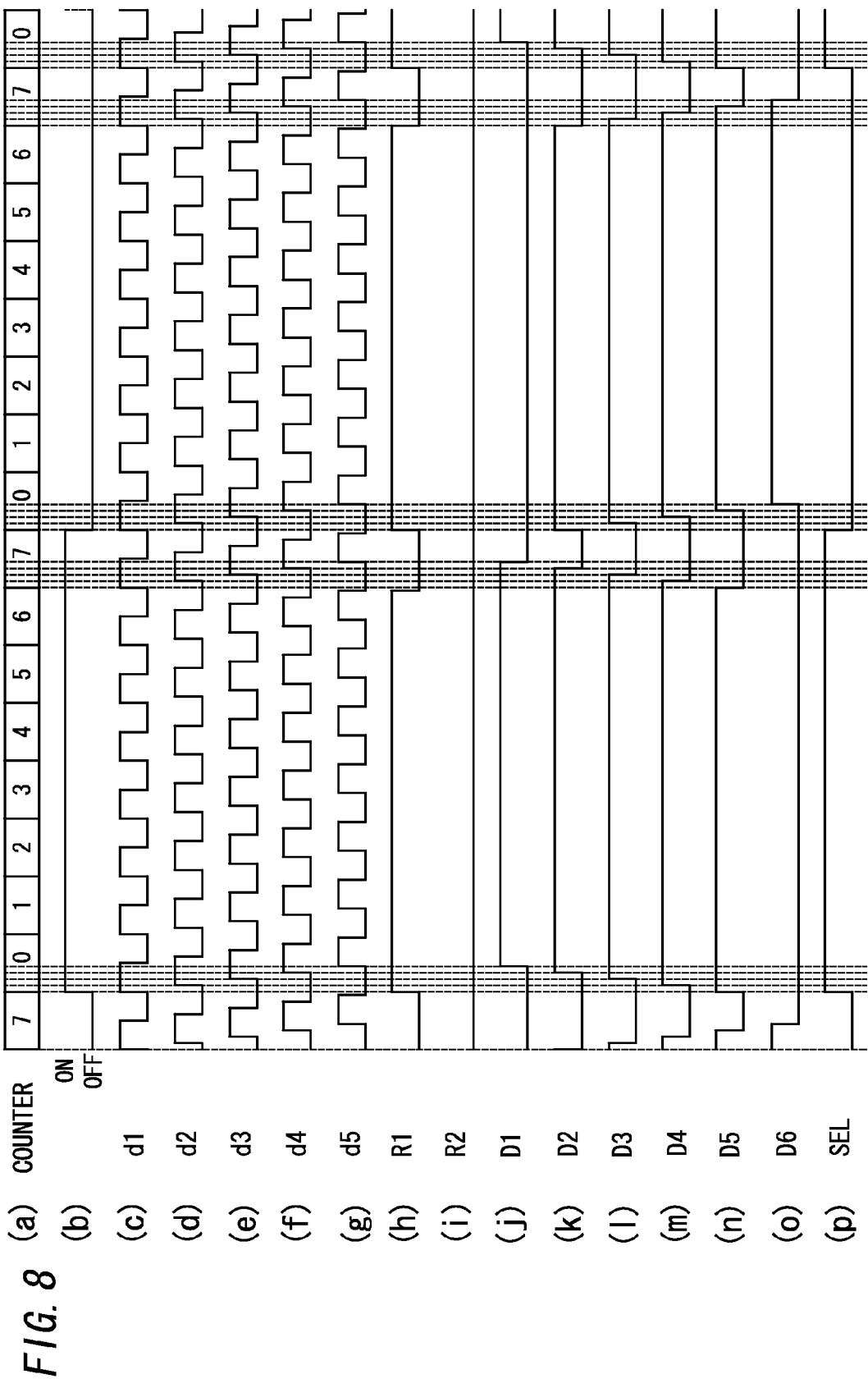
FIG. 8 is an explanation diagram illustrating the operation of the above applied voltage control unit.

The next explanation referring FIGS. 7 and 8 is made to an example of the driving device of the present embodiment. The driving device is used for driving the charge-coupled device including the line of the electrodes 10 (10A to 10J) as illustrated in FIG. 2. The electrode 10A is used as the holding electrode (first holding electrode) for forming the holding region (first holding region) for accumulating the electric charges 12 generated in the light projection period Tb (the ON period in FIG. 8(b)). The electrode 10H is used as the holding electrode (second holding electrode) for forming the holding region (second holding region) for accumulating the electric charges 12 generated in the no light projection period Td (the OFF period in FIG. 8(b)). In the light projection period Tb, the set of the electrodes 10B to 10F is used as the line of the transfer electrodes. Further, the electrode 10G is used as the barrier electrode for forming the potential barrier for preventing the electric charges 12 generated in the light projection period Tb from flowing into the second holding region. In the no light projection period Td, the set of the electrodes 10C to 10G is used as the line of the transfer electrodes. Further, the electrode 10B is used as the barrier electrode for forming the potential barrier for preventing the electric charges 12 generated in the no light projection period Td from flowing into the first holding region. The electrode 10I is used as an extracting electrode for taking out the electric charges 12 stored in the first holding region. The electrode 10J is used as an extracting electrode for taking out the electric charges 12 stored in the second holding region.

The driving device illustrated in FIG. 7 includes the clock generation unit 3 and the applied voltage control unit 5. The clock generation unit 3 is configured to output the clock signal.

The applied voltage control unit 5 is configured to perform the transfer process of controlling the charge-coupled device to transfer the electric charges 12. The transfer process includes the first transfer process and the second transfer process.

The applied voltage control unit 5 performs the first transfer process in the light projection period Tb. The applied voltage control unit 5 is configured to, in the first transfer process, switch the voltage applied to the transfer electrode 10 from the control voltage to the reference voltage in order from the first end (the electrode 10F) to the second end (the electrode 10B) of the line of the transfer electrodes 10B to 10F based on the clock signal so as to transfer the electric charges 12 to the holding region corresponding to the first holding electrode 10A.

The applied voltage control unit 5 performs the second transfer process in the no light projection period Td. The applied voltage control unit 5 is configured to, in the second transfer process, switch a voltage applied to the transfer electrode 10 from the control voltage to the reference voltage in order from the second end (the electrode 10C) to the first end (the electrode 10G) of the line of the transfer electrodes 10C to 10G based on the clock signal so as to transfer the electric charges 12 to the holding region corresponding to the second holding electrode 10H.

The applied voltage control unit 5 includes a control circuit 250 and a driving circuit 280.

The control circuit 250 is configured to create a driving signal defined as a binary signal having a first value (high level) and a second value (low level) for each electrode 10 and output the created driving signal. Alternatively, the first value may define the low level and the second value may define the high level.

The driving circuit 280 includes plural drivers 28 (28A to 28J) respectively associated with the plural electrodes 10 (10A to 10J). The driver 28 is configured to, while the driving signal has the first value, apply the control voltage to the associated electrode 10, and is configured to, while the driving signal has the second value, apply the reference voltage to the associated electrode 10. Consequently, the driving circuit 280 is configured to, upon receiving the driving signal from the control circuit 250, apply the control voltage to the electrode 10 associated with the received driving signal when the received driving signal has the first value, and apply the reference voltage to the electrode 10 associated with the received driving signal when the received driving signal has the second value.

The control circuit 250 includes the delay circuit (ring oscillator) 21, the synchronization circuit (phase comparison unit) 15, a driving signal generation circuit 251, and a driving control circuit 252.

The delay circuit 21 includes the plural delay elements connected circularly. In the instance illustrated in FIG. 7, the delay circuit 21 is constituted by the plural NOT gates (inverters) 22 having the same delay time td. The NOT gate 22 is configured to delay a signal received by constant time (delay time td) and output the resultant signal. In the instance illustrated in FIG. 7, the ring oscillator 21 includes the nine NOT gates 22. The delay time td of the NOT gate 22 is selected such that an oscillation period of the ring oscillator 21 is identical to the period of the clock signal. The oscillation period T of the ring oscillator 21 is expressed as $T=2*n*td$, wherein n indicates the number of the NOT gates 22.

The ring oscillator 21 generates five timing signals d1 to d5. The timing signal d2 is delayed from the timing signal d1 by only $2*td$. The timing signal d3 is delayed from the timing signal d2 by only $2*td$. The timing signal d4 is delayed from the timing signal d3 by only $2*td$. The timing signal d5 is delayed from the timing signal d4 by only $2*td$. Consequently, the delay circuit 21 is configured to generate plural timing signals (d1 to d5) delayed by the predetermined time $(2*td)$.

The synchronization circuit 15 is configured to synchronize one (the timing signal d1) of the plural timing signals (d1 to d5) with the clock signal. As a result, the timing signals d1 to d5 as shown in FIG. 8(c) to (g) are obtained. In the instance shown in FIG. 7, the clock signal is equivalent to the timing signal d1.

The driving signal generation circuit 251 is configured to generate the plural (six) driving signals D1 to D6 respectively associated with the plural (six) electrodes 10B to 10G. As illustrated in FIG. 7, the driving signal generation circuit 251 includes the plural (six) selectors 25 (25A to 25F), the plural (four) data latches 24 (24A to 24D), the reference pulse generation unit 23, and a switching circuit 253.

The reference pulse generation unit 23 is configured to output a reference timing signal R1 based on the timing signal d1. As shown in FIG. 8(h), the reference timing signal R1 has the second value (low level) during time corresponding to one period of the timing signal d1 in the light projection period Tb and the no light projection period Td. In other words, the reference timing signal R1 has the first value (high level) unless the time period having the same length as the sevenfold period of the timing signal d1 elapses from the start of the light projection period Tb or the no light projection period Td. After a lapse of the time period having the same length as the sevenfold period of the timing signal d1, the reference timing signal R1 has the second value (low level) only during the time period having the same length as one period of the timing signal d1.

The switching circuit 253 is configured to provide a switching signal having a high level or a low level to each selector 25 in response to instructions from the driving control circuit 252. Further, the switching circuit 253 is configured to output a barrier signal R2. As shown in FIG. 8(i), the barrier signal R2 is used for applying the reference voltage to the electrode 10, and is always kept at the second value (low level).

The selector 25 has a first input terminal, a second input terminal, and an output terminal. Upon receiving a high-level signal, the selector 25 outputs, via the output terminal, a signal inputted via the first input terminal. Upon receiving a low-level signal, the selector 25 outputs, via the output terminal, a signal inputted via the second input terminal. The timing signal d3 is inputted into the first input terminal of the selector 25A, and the timing signal d2 is inputted into the second input terminal of the selector 25A. The timing signal d2 is inputted into the first input terminal of the selector 25B, and the timing signal d3 is inputted into the second input terminal of the selector 25B. The selector 25C has the first input terminal connected to the output terminal Q of the data latch 24D, the second input terminal receiving the barrier signal R2, and the output terminal connected to the driver 28B. The selector 25D has the first input terminal connected to the output terminal Q of the data latch 24C, the second input terminal receiving the reference timing signal R1, and the output terminal connected to the driver 28C. The selector 25E has the first input terminal receiving the reference timing signal R1, the second input terminal connected to the output terminal Q of the data latch 24C, and the output terminal connected to the driver 28F. The selector 25F has the first input terminal receiving the barrier signal R2, the second input terminal connected to the output terminal Q of the data latch 24D, and the output terminal connected to the driver 28G.

As mentioned in the above, the data latch 24 is the D flip-flop including the output terminal Q, the data terminal D, and the clock terminal. The reference timing signal R1 is inputted into the data terminals D of the respective data latches 24.

The data latch 24A has the clock terminal connected to the output terminal of the selector 25A and the output terminal Q connected to the driver 28D. Therefore, while the switching signal has the high level, the data latch 24A outputs the reference signal R1 delayed by only the delay time (4*td) of the timing signal d3. While the switching signal has the low level, the data latch 24A outputs the reference signal R1 delayed by only the delay time (2*td) of the timing signal d2.

The data latch 24B has the clock terminal connected to the output terminal of the selector 25B and the output terminal Q connected to the driver 28E. Therefore, while the switching signal has the high level, the data latch 24B outputs the reference signal R1 delayed by only the delay time (2*td) of the timing signal d2. While the switching signal has the low level, the data latch 24B outputs the reference signal R1 delayed by only the delay time (4*td) of the timing signal d3.

The data latch 24C has the clock terminal receiving the timing signal d4 and the output terminal Q connected to the second input terminal of the selector 25E. Therefore, the data latch 24C outputs the reference signal R1 delayed by only the delay time (6*td) of the timing signal d4.

The data latch 24D has the clock terminal receiving the timing signal d5 and the output terminal Q connected to the second input terminal of the selector 25F. Therefore, the data latch 24D outputs the reference signal R1 delayed by only the delay time (8*td) of the timing signal d5.

The driving control circuit 252 outputs the driving signals to the respective drivers 28 (28A, 28H, 28I, and 28J) based on the clock signal. Namely, throughout the light projection period Tb and the no light projection period Td, the driving control circuit 252 provides the driving signal having the first value (high level) to the drivers 28A and 28H respectively associated with the electrodes 10A and 10H used as the holding electrodes. Further, throughout the light projection period Tb and the no light projection period Td, the driving control circuit 252 provides the driving signal having the second value (low level) to the drivers 28I and 28J respectively associated with the electrodes 10I and 10J used as the extracting electrodes.

Additionally, the driving control circuit 252 controls the switching circuit 253 based on the clock signal from the clock generation unit 3. As shown in FIG. 8(b), the driving control circuit 252 controls the switching circuit 253 to output the switching signal having the high level in the light projection period Tb, and controls the switching circuit 253 to output the switching signal having the low level in the no light projection period Td.

As shown in FIG. 8(j) to (o), during the light projection period Tb, the signal (the reference timing signal R1 delayed by only 8*td) outputted from the data latch 24D is used as the driving signal D1 associated with the electrode 10B. Further, the signal (the reference timing signal R1 delayed by only 6*td) outputted from the data latch 24C is used as the driving signal D2 associated with the electrode 10C. The signal (the reference timing signal R1 delayed by only 4*td) outputted from the data latch 24A is used as the driving signal D3 associated with the electrode 10D. The signal (the reference timing signal R1 delayed by only 2*td) outputted from the data latch 24B is used as the driving signal D4 associated with the electrode 10E. The reference timing signal R1 is used as the driving signal D5 associated with the electrode 10F. The barrier signal R2 is used as the driving signal D6 associated with the electrode 10G.

During the light projection period Tb, the reference voltage is applied to the electrode 10G, and then the electric charges 12 are prevented from flowing into the holding region corresponding to the electrode 10H (see FIG. 4(a)). The driving signal D4 is delayed from the driving signal D5 by the predetermined time (2*td). The driving signal D3 is delayed from the driving signal D4 by the predetermined time (2*td). The driving signal D2 is delayed from the driving signal D3 by the predetermined time (2*td). The driving signal D1 is delayed from the driving signal D2 by the predetermined time (2*td). The voltages applied to the respective electrodes 10F, 10E, 10D, 10C, and 10B are switched from the control voltage to the reference voltage in this order. In brief, the voltages applied to the electrodes 10 are switched from the control voltage to the reference voltage in order from the electrode 10F at the first end to the electrode 10B at the second end of the line of the transfer electrodes 10A to 10F. Accordingly, as shown in FIG. 4(b) to (g), the electric charges 12 accumulated in the potential well 11 associated with the electrodes 10B to 10F are collected in the potential well 11 associated with only the electrode 10A. In other words, the electric charges 12 are transferred to the holding region associated with the electrode 10A.

In contrast, during the no light projection period Td, the barrier signal R2 is used as the driving signal D1 associated with the electrode 10B. Further, the reference timing signal R1 is used as the driving signal D2 associated with the electrode 10C. The signal (the reference timing signal R1 delayed by only 2*td) outputted from the data latch 24A is used as the driving signal D3 associated with the electrode 10D. The signal (the reference timing signal R1 delayed by only 4*td) outputted from the data latch 24B is used as the driving signal D4 associated with the electrode 10E. The signal (the reference timing signal R1 delayed by only 6*td) outputted from the data latch 24C is used as the driving signal D5 associated with the electrode 10F. The signal (the reference timing signal R1 delayed by only 8*td) outputted from the data latch 24D is used as the driving signal D6 associated with the electrode 10G.

During the no light projection period Tb, the reference voltage is applied to the electrode 10B, and then the electric charges 12 are prevented from flowing into the holding region corresponding to the electrode 10A (see FIG. 4(h)). The driving signal D3 is delayed from the driving signal D2 by the predetermined time (2*td). The driving signal D4 is delayed from the driving signal D3 by the predetermined time (2*td). The driving signal D5 is delayed from the driving signal D4 by the predetermined time (2*td). The driving signal D6 is delayed from the driving signal D5 by the predetermined time (2*td). The voltages applied to the respective electrodes 10C, 10D, 10E, 10F, and 10G are switched from the control voltage to the reference voltage in this order. In brief, the voltages applied to the electrodes 10 are switched from the control voltage to the reference voltage in order from the electrode 10C at the second end to the electrode 10G at the first end of the line of the transfer electrodes 10C to 10G. Accordingly, as shown in FIG. 4(h), the electric charges 12 accumulated in the potential well 11 associated with the electrodes 10C to 10H are collected in the potential well 11 associated with only the electrode 10H. In other words, the electric charges 12 are transferred to the holding region associated with the electrode 10H.

Consequently, the driving signal generation circuit 251 is configured to generate the driving signals D1 to D6 respectively associated with the transfer electrodes 10 based on the plural timing signals (d1 to d5).

The delay signal generation unit 26 illustrated in FIG. 10(a) can be adopted as an alternative to the delay signal generation unit 26 including the ring oscillator 21 and the data latches 24. In this modification, output voltages of buffers 27 connected in such a manner as shown in FIG. 10(a) are applied to the electrodes 10. In the illustrated instance, to apply the control voltages to the respective three electrodes 10, the three buffers are provided. The outputs of the respective buffers 27 are applied to the respective different electrodes 10.

Figure 9:
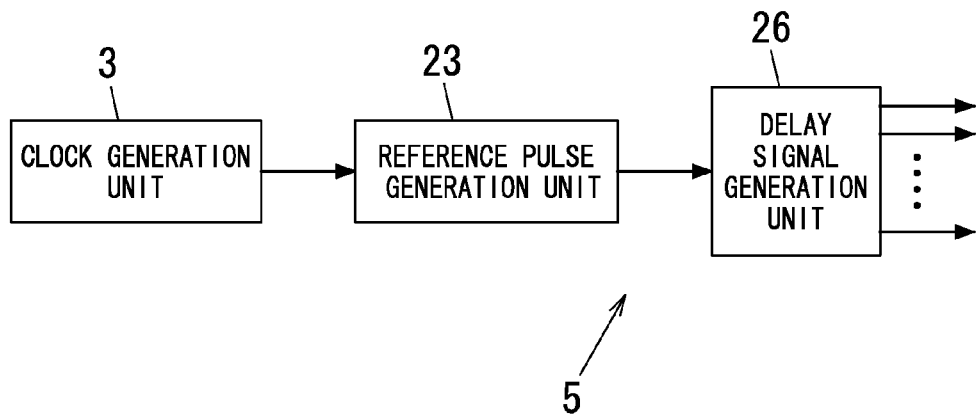
FIG. 9 is a block diagram illustrating a primary part of the above applied voltage control unit.

As shown in FIG. 9, the timing signal which the reference pulse generation unit 23 generates by use of the clock signal outputted from the clock generation unit 3 is inputted into the delayed signal generation unit 26. In a similar manner as the reference timing signal S5 illustrated in FIG. 6(e), a signal having the low level only during the time period having the same length as one period of the clock signal may be used as the timing signal.

The buffers 27 are connected such that the input terminal of one buffer 27 is connected to the output terminal of another buffer 27. Therefore, the output of the first buffer 27 which receives the timing signal is inputted in to the second buffer 27. The output of the second buffer 27 is inputted in to the third buffer 27. Consequently, the output of the upper buffer 27 in FIG. 10(a) is equivalent to a signal passing through the single buffer 27. The output of the middle buffer 27 in FIG. 10(a) is equivalent to a signal passing through the two buffers 27. The output of the lower buffer 27 in FIG. 10(a) is equivalent to a signal passing through the three buffers 27. As a result, the output of the middle buffer 27 is delayed from the output of the upper buffer 27. The output of the lower buffer 27 is delayed from the output of the middle buffer 27. Consequently, according to this configuration, the outputs from the buffers 27 showing the substantially same relation as the outputs from the data latches 24 shown in FIG. 5 can be obtained.

Alternatively, the delayed signal generation unit 26 as shown in FIG. 10(b) may be adopted. In this arrangement, the delayed signal generation unit 26 includes plural buffers 31 having input terminals connected to each other. The buffers 31 have output terminals connected to capacitors C1 to C3 having different capacitances. The terminal voltages of the respective capacitors C1 to C3 are applied to the respective electrodes 10. Also with adopting this configuration, it is possible to delay a signal by a time difference having the length shorter than that of the period of the clock signal. In this configuration, a timing of rise in the signal is delayed with an increase in the capacitance of the capacitor (C1 to C3). Therefore, when the relation of C1<C2<C3 is fulfilled, in response to fall in a voltage used as a reference, first the terminal voltage of the capacitor C1 falls, and thereafter the terminal voltage of the capacitor C2 falls, and finally the terminal voltage of the capacitor C3 falls.

With adopting the configuration shown in FIG. 10(a) or FIG. 10(b), it is possible to simplify the circuit configuration relative to the configuration employing the ring oscillator 21. Besides, to adopt the delayed signal generation unit 26 with the configuration shown in FIG. 10(a) or FIG. 10(b), it is necessary to provide the selectors 25 on the rear side of the delayed signal generation unit 26 in order to capable of selecting the order of timings of applying the output voltages of the delayed signal generation unit 26 to the respective electrodes 10 by use of the selection signal SEL (see FIG. 6).

Figure 10:
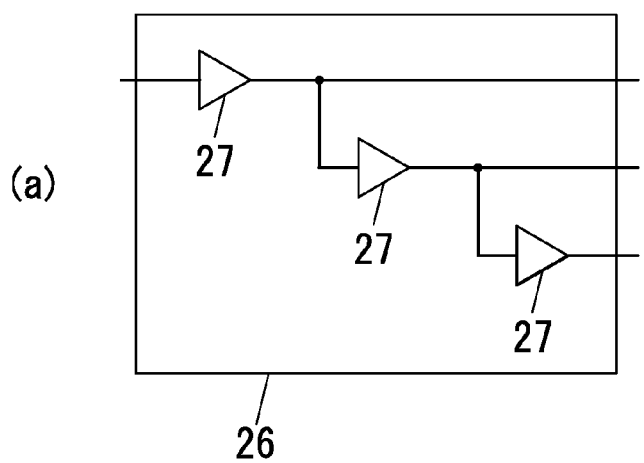
FIG. 10 shows circuit diagrams (a) and (b) each illustrating a delayed signal generation unit used in the above applied voltage control unit.
Figure 10:
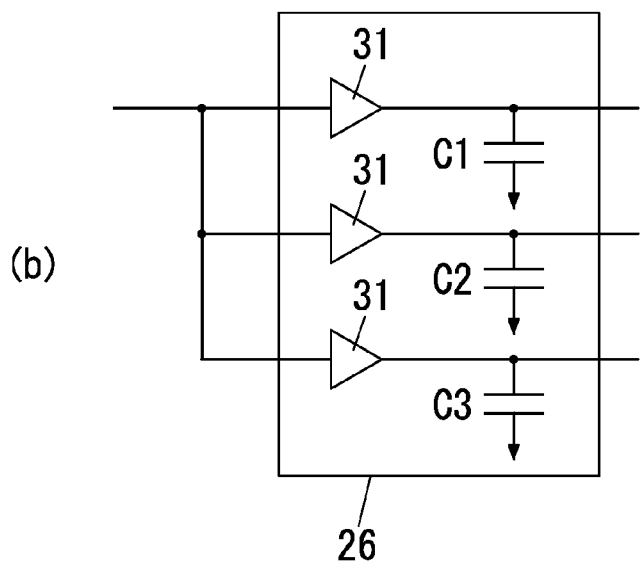

However, with regard to the configuration shown in FIG. 5 or the configuration shown in FIG. 10, in order to apply the control voltage to the electrode 10, it is necessary to provide drivers for adjusting level shifts of voltages or impedance. The driver may be provided on the input side or the output side of the delayed signal generation unit 26. When the drivers do not show uniform characteristics, the control voltages may be applied to the electrodes 10 in the incorrect order.

Figure 11:
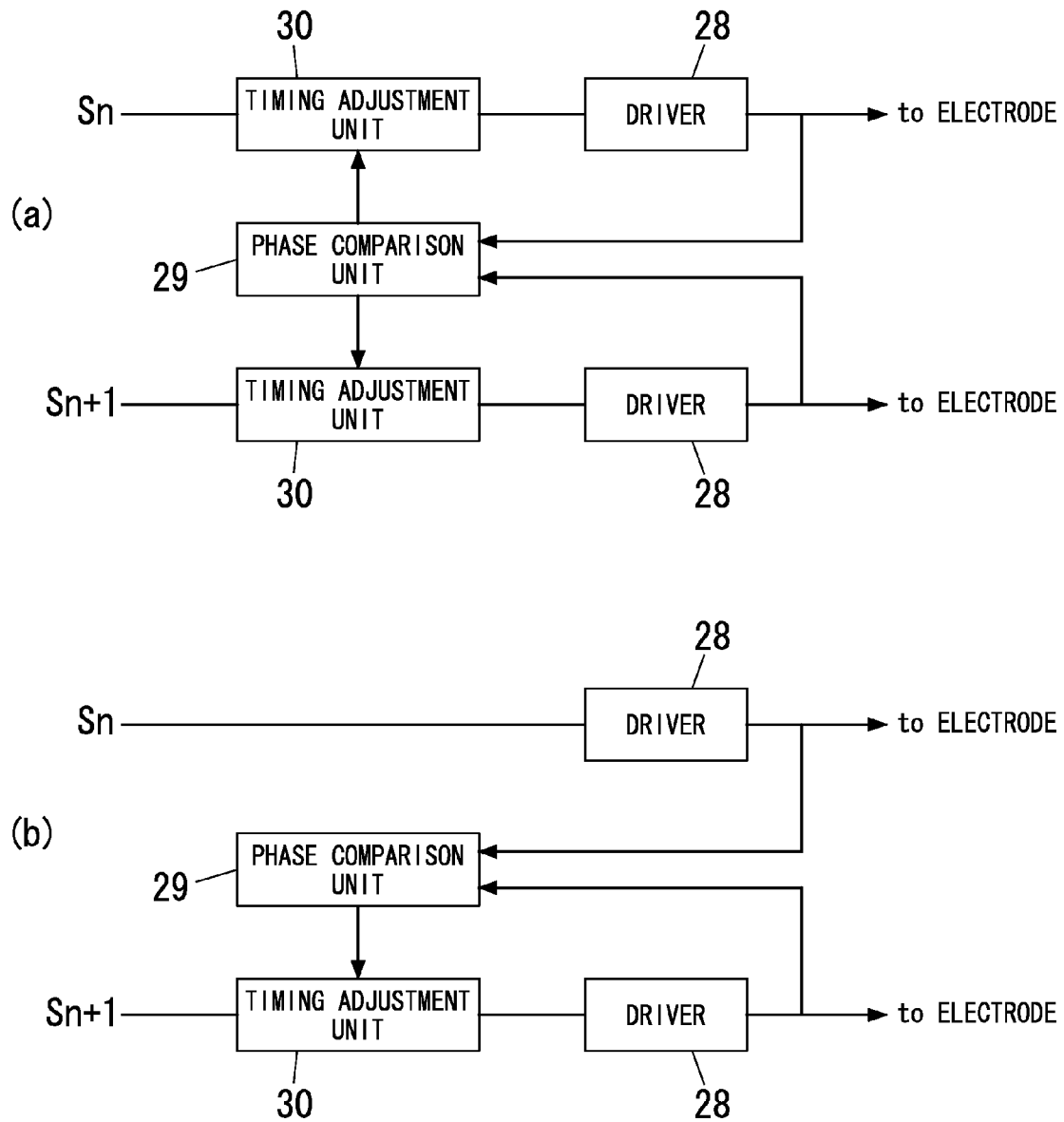
FIG. 11 shows circuit diagrams (a) and (b) each illustrating a primary part of the applied voltage control unit used in the above driving device.

For example, signals Sn and Sn+1 are used for instructing timings at which the control voltages are applied to the respective adjacent electrodes 10. Further, as shown in FIG. 11(a) and (b), the paired drivers 28 for applying the control voltages respectively associated with the signals Sn and Sn+1 to the electrodes 10 are provided. To prevent the control voltages from being applied to the electrodes 10 in the incorrect order, a phase comparison unit 29 is employed for measuring a phase difference between outputs of the paired drivers 28. In the configuration shown in FIG. 11(a), a timing adjustment unit 30 is employed for adjusting timings of voltages inputted into the respective drivers 28 so as to keep the measured phase difference constant.

In the configuration illustrated in FIG. 11(a), the timing adjustment units 30 are connected to respective inputs of the paired drivers 28 configured to apply the control voltages to the paired adjacent electrodes 10. The single phase comparison unit 28 is configured to instruct the timing adjustment units 30 to adjust the phases. In contrast, as shown in FIG. 11(b), the single timing adjustment unit 30 may be connected to any one of the inputs of the paired drivers 28 configured to apply the control voltages to the paired adjacent electrodes 10. In this arrangement, the timing adjustment unit 30 uses an output timing of one driver 28 as a reference and controls an output timing of the other driver 28 based on the reference. Therefore, the adjustment of the timings can be facilitated.

When the configuration shown in FIG. 11(a) is adopted, the same number of the timing adjustment units 30 as the electrodes 10 is necessary. Further, each phase comparison unit 29 is required to provide two outputs. In contrast, with adopting the configuration shown in FIG. 11(b), the number of the timing adjustment units 30 is smaller than the number of the electrodes 10 by one. Moreover, the phase comparison unit 29 is required to provide only one output. Accordingly, the configuration can be simplified.

Figure 12:
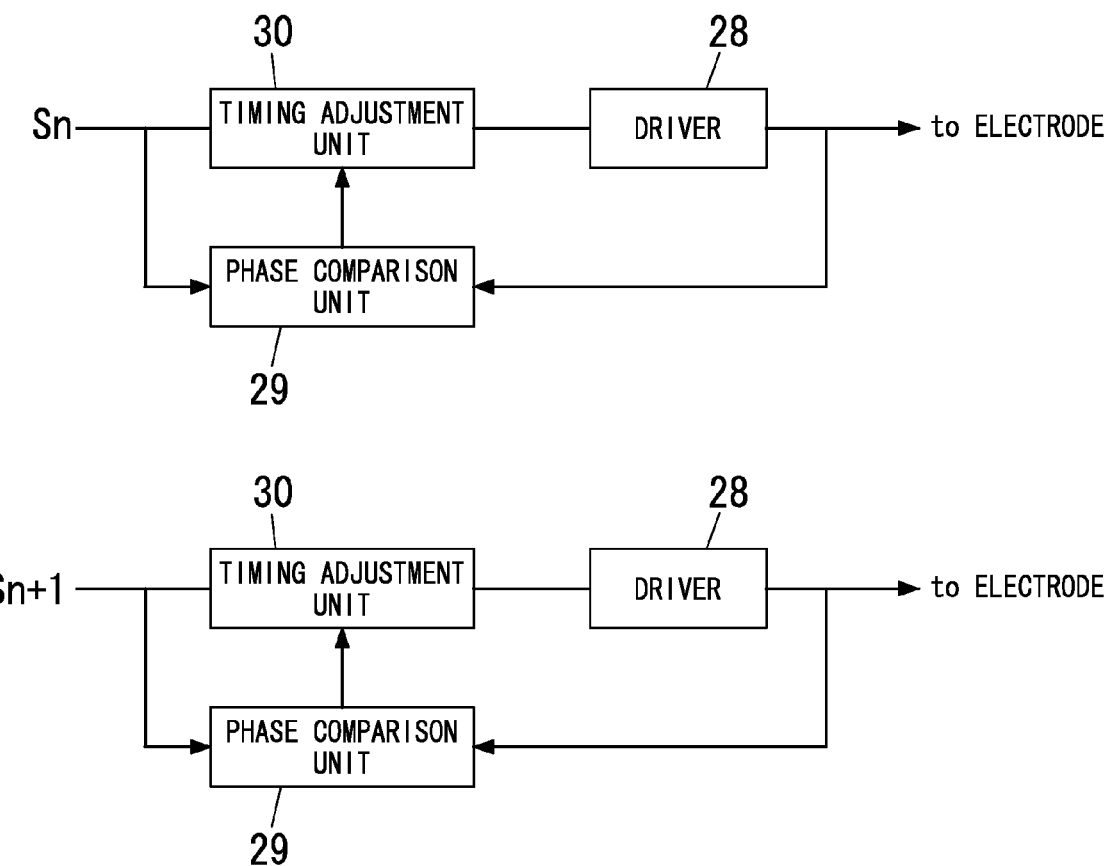
FIG. 12 is a block diagram illustrating a primary part of another instance of the applied voltage control unit used in the above driving device.
Figure 13:
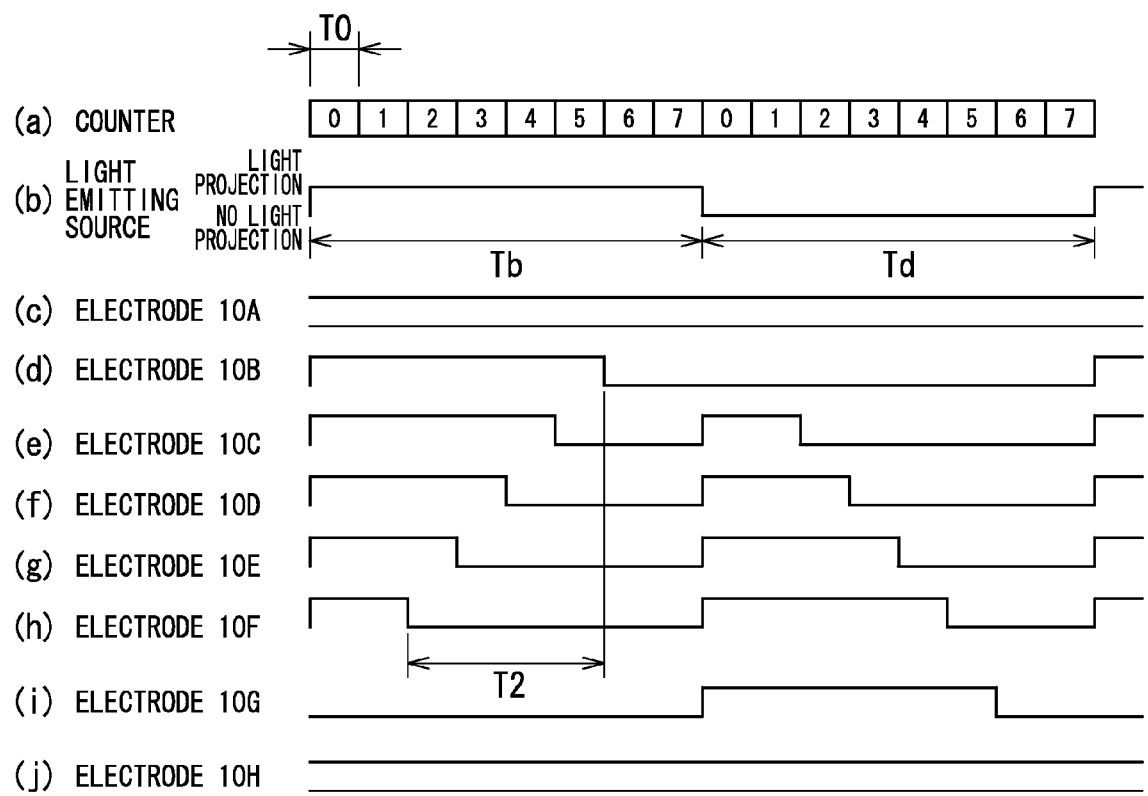
FIG. 13 is an explanation diagram illustrating an operation of the prior art.

Alternatively, as shown in FIG. 12, a configuration for adjusting the phase difference between an output of the driver 28 and an input voltage inputted into the driver 28 may be provided for each of the drivers 28 associated with the respective electrodes 10. In this configuration, the phase comparison unit 29 measures the phase difference between the output voltage of the driver 28 and the input voltage inputted into the driver 28. The phase comparison unit 29 controls the timing adjustment unit 30 so as to keep the measured phase difference constant.

According to this configuration, the phase difference between the output voltage of the driver 28 and the input voltage inputted into the driver 28 is kept constant. Therefore, the order of the outputs from the drivers 28 is correct unless the order of the input voltages associated with the respective electrodes 10 is incorrect.

With regard to a configuration where the area of the potential well 11 is decreased with a lapse of time, an amount of the electric charges per unit area is increased as the area of the potential well 11 is decreased. Therefore, it is considered that an overflow of the electric charges is likely to occur due to a diffusion capacity. In consideration of this, it is preferred that the time interval T1 is prolonged with a decrease in the area of the potential well 11 in order to prevent occurrence of the overflow of the electric charges.

Thus, the following operation for preventing a waste of the electric charges can be adopted. In this operation, the time interval T1 is decreased down to a predetermined value when the area of the potential well 11 is relatively large, and the time interval T1 is increased up to a predetermined value when the area of the potential well 11 is relatively small.

During the light projection period Tb, the control circuit 250 outputs the five driving signals D5, D4, D3, D2, and D1 in this order. For example, the control circuit 250 may prolong the predetermined time (the time interval of the driving signals) in accordance with the number of times of output of the driving signal. In other words, the control circuit 250 may increase the predetermined time relative to the previous predetermined time on the basis of the number of times of output of the driving signal. For example, during the light projection period Tb, the control circuit 250 may increase the predetermined time by the time td each time the number of times of output of the driving signal is increased by one. When an initial value of the predetermined time is 2*td, the driving signal D4 is delayed from the driving signal D5 by the predetermined time (2*td). The driving signal D3 is delayed from the driving signal D4 by the predetermined time (3*td). The driving signal D2 is delayed from the driving signal D3 by the predetermined time (4*td). The driving signal D1 is delayed from the driving signal D2 by the predetermined time (5*td). Besides, in a similar manner as the light projection period Tb, the control circuit 250 may prolong the predetermined time in accordance with the number of times of output of the driving signal in the no light projection period Td.

In other words, in a process of decreasing the area of the potential well 11 with a lapse of time, the time interval between the timings of applying the control voltages to the respective electrodes 10 is increased in accordance with a decrease in the number of the electrodes 10 to which the control voltages are applied. With regard to the configuration shown in FIG. 5, such an operation can be realized by adjusting the number of the NOT gates 22. With regard to the configuration shown in FIG. 8(a), the above operation can be realized by adjusting the number of the buffers 27. With regard to the configuration shown in FIG. 8(b), the above operation can be realized by adjusting the capacitance of the capacitor.

In the aforementioned embodiment, an explanation is made to the operation providing the light projection period during which the light emitting source 1 emits light to the target space and the no light projection period during which the light emitting source 1 emits no light. The aforementioned charge-coupled device can be used in a device for calculating a distance to an object existing in the target space from an image created by the imaging element 2. For example, the light emitting source 1 is driven with a modulation signal to emit modulated light having a modulated intensity to the target space, and the aforementioned charge-coupled device is used as the imaging element 2. In this situation, images created at timings corresponding to plural predetermined phases in the modulation signal are obtained. Use of these images enables calculation of the distance to the object present in the target space. In this configuration, it is possible to obtain a distance image having pixel values representing calculated distance values.

For example, received light intensities at respective positions in a light receiving surface of the imaging element 2 are varied with an intensity variation of the modulated light. With measuring an amount of received light at the imaging element 2 at a timing synchronized with the modulated light, it is possible to calculate a phase difference corresponding to a time difference between timings of emitting and receiving the modulated light. Since the modulated light has a known frequency and the phase difference can be converted to the time difference, as a result, the distance to the object can be calculated. In brief, the distance to the object can be measured by means of the TOF (Time Of Flight) method which calculates flight time of light by use of modulated light having a modulated intensity.

In the aforementioned configuration, the electric charges accumulated during the light projection period are supplied to the holding region associated with the electrodes (1) serving as the holding electrode and then stored therein, and the electric charges accumulated during the no light projection period are supplied to the holding region associated with the electrodes (8) serving as the holding electrode and then stored therein. Meanwhile, in an example of creating the distance image, the electric charges accumulated at timings respectively corresponding to two phase synchronized with the modulated signal can be distributed to the respective holding regions and then stored therein.

For example, when the modulated light shows a sinusoidal variation of intensity, the target space is imaged at four different timings respectively corresponding to the phases of 0, 90, 180, and 270 degree in the modulated signal. In this example, the distance to the object can be calculated from the images created at the four different timings. With using the aforementioned charge-coupled device as the imaging element 2, two sets of the electric charges accumulated at two difference timings of the four different timings can be stored in the respective holding regions. For example, the electric charges are accumulated through a process of enlarging the area of the potential wells 11 during periods respectively corresponding to any two different timings, and thereafter the electric charges accumulated at each of the two different timings are held in the holding regions respectively associated with the electrodes (1) and (8). With performing the operation one time, the electric charges accumulated at the two different timings are stored in the imaging element 2. To take out the electric charges accumulated at the four different timings from the imaging element 2, it is sufficient that the operation of taking out electric charges is performed twice. Consequently, the number of times of taking out the electric charges from the imaging element 2 can be halved.

A process for creation of the distance image by use of the electric charges taken out from the imaging element 2 is performed by the image generation unit 6 as illustrated in FIG. 3. Thus, the processing device configured to generate the distance image to obtain the spatial information includes, in a similar manner as the device configured to generate the grayscale difference image, the driving device constituted by the clock generation unit 3 and the applied voltage control unit 5, the light projection control unit 4, the image generation unit 6, and the judgment unit 7. This processing device is used together with the light emitting source 1 and the imaging element 2 to constitute the spatial information detecting device obtaining the spatial information from the distance image.

In the aforementioned embodiment, the applied voltage control unit 5 delays the reference timing signal created in synchronization with the clock signal in order to produce the control voltage applied to the electrode. Alternatively, the applied voltage control unit 5 may delay the clock signal in order to produce the control voltage.

For example, with delaying the clock signal by use of a delay element to generate plural delayed clock signals associated with different delay time and then inputting the clock signal and the delayed clock signals into respective different signal generation units, it is possible to generate signals respectively equivalent to the rectangular wave signals S5 to S8. The signal generation unit includes a counter and a signal generation circuit, for example. The signal generation circuit determines, based on an output from the counter, a period during which an output of the signal generation unit has a high level and a period during which the output of the signal generation unit has a low level. According to this configuration, the rectangular wave signal outputted from the signal generation unit is delayed by only delay time given by a clock of the delay element. Therefore, it is possible to generate the signals respectively equivalent to the aforementioned rectangular wave signals S6 to S8.

As mentioned in the above, the driving device of the present embodiment is designed to control the charge-coupled device in which the plural electrodes 10 are arranged on (over) the surface of the device formation layer 13 made of a semiconductor. The driving device of the present embodiment is configured to control the potential well formed in the device formation layer 13 in response to applying the control voltage to the electrode 10 so as to transfer the electric charges 12 within the device formation layer 13. The driving device of the present embodiment includes the clock generation unit 3 configured to generate the clock signal, and the applied voltage control unit 5 configured to vary the area of the potential well with regard to a plane parallel to the surface of the device formation layer 13 by controlling the timings at which the control voltages are applied to the respective adjacent electrodes 10 of the electrodes 10. The applied voltage control unit 5 is configured to delay the clock signal or the reference timing signal generated in synchronization with the clock signal so as to generate the control voltages applied to the adjacent electrodes at the different timings. The time interval between the control voltages applied to the adjacent electrodes is selected to be shorter than the period of the clock signal.

In other words, the driving device of the present embodiment is used for controlling the charge-coupled device to transfer the electric charges 12. The charge-coupled device includes the semiconductor layer (device formation layer) 13 doped with impurities, the electrically insulating layer (insulating layer) 14 formed on/over the semiconductor layer 13, and the line of the transfer electrodes 10 positioned on/over the electrically insulating layer 14 for forming the potential well within the semiconductor layer 13. The driving device includes the clock generation unit 3 and the applied voltage control unit 5. The clock generation unit 3 is configured to output the clock signal. The applied voltage control unit 5 configured to perform the transfer process of switching the voltage applied to the transfer electrode 10 from the control voltage for forming the potential well to the reference voltage for eliminating the potential well in order from the first end to the second end (the transfer electrode 10F to the transfer electrode 10B) of the line of the transfer electrodes 10 based on the clock signal. The applied voltage control unit 5 includes the control circuit 250 and the driving circuit 280. The control circuit 250 is configured to create the driving signal defined as the binary signal having the first value and the second value for each transfer electrode 10 and output the created driving signal. The driving circuit 280 is configured to, upon receiving the driving signal, apply the control voltage to the transfer electrode 10 associated with the received driving signal when the received driving signal has the first value, and apply the reference voltage to the transfer electrode 10 associated with the received driving signal when the received driving signal has the second value. The control circuit 250 is configured to, in the transfer process, delay the second driving signal defined by the driving signal associated with one of the adjacent transfer electrodes 10 from the first driving signal defined by the driving signal associated with the other of the adjacent transfer electrodes 10 so as to adjust the phase difference between the first driving signal and the second driving signal to the value corresponding to the predetermined time shorter than the period of the clock signal.

According to the driving device of the present embodiment, the driving device generates the control voltages applied to the adjacent electrodes at the different timings by means of delaying the clock signal or the reference timing signal generated in synchronization with the clock signal. Further, the driving device of the present embodiment shortens the time defining a delay of the control voltage applied to each electrode than the period of the clock signal. Consequently, it is possible to shorten the time which it takes for moving electric charges from the potential well formed over the region associated with the plural electrodes to the potential well over the region associated with the fewer electrodes.

Therefore, the transfer period of electric charges within the charge-coupled device can be shortened without shortening the period of the clock signal.

Further, the driving device of the present embodiment may employ the following configuration. In this configuration, the holding electrode 10 used for forming the holding region for holding the electric charges within the device formation layer 13 is juxtaposed to the plural electrodes 10. In addition, the applied voltage control unit 5 is configured to move the electric charges accumulated through the process of applying the control voltages to the respective plural electrodes 10 to the holding region by decreasing the area of the potential well by means of applying the delayed control voltages to the respective electrodes 10 in descending order of the distance from the holding electrode. In other words, the charge-coupled device includes the holding electrode 10 positioned on/over the electrically insulating layer 14 for generating, in the semiconductor layer 13, the potential well serving as the holding region for holding the electric charges transferred by the driving device. The holding electrode 10 is positioned adjacent to the second end of the line of the transfer electrodes 10 (the holding electrode 10 is arranged adjacent to the transfer electrode 10B). The applied voltage control unit 5 is configured to, in the transfer process, switch the voltage applied to the transfer electrode 10 from the control voltage to the reference voltage in order from the first end to the second end of the line of the transfer electrodes 10 (in order from the transfer electrode 10F to the transfer electrode 10B) based on the clock signal so as to transfer the electric charges 12 to the holding region.

Further, the driving device of the present embodiment can employ the following configuration. In this configuration, the first holding electrode 10 (10A) and the second holding electrode 10 (10H) used for forming the holding regions for holding the electric charges within the device formation layer 13 are juxtaposed to the plural electrodes 10 (10B to 10G) such that the electrodes 10 (10B to 10G) are positioned between the first holding electrode 10 (10A) and the second holding electrode 10 (10G). In addition, the applied voltage control unit 5 is configured to, in the first period (light projection period), move the electric charges accumulated through the process of applying the control voltages to the respective plural electrodes 10B to 10F to the holding region associated with the first holding electrode 10A by decreasing the area of the potential well by means of applying the delayed control voltages to the respective electrodes 10B to 10F in order from the electrode 10F furthest from the first holding electrode 10A. Moreover, the applied voltage control unit 5 is configured to, in the second period (no light projection period) different from the first period, move the electric charges accumulated through the process of applying the control voltages to the respective plural electrodes 10C to 10G to the holding region associated with the second holding electrode 10H by decreasing the area of the potential well by means of applying the delayed control voltages to the respective electrodes 10C to 10G in order from the electrode 10C furthest from the second holding electrode 10H. In other words, the charge-coupled device includes the first and second holding electrodes 10 positioned on/over the electrically insulating layer 14 for generating, in the semiconductor layer 13, the potential wells each serving as the holding region for holding the electric charges transferred by the driving device. The first holding electrode 10 (10A) is positioned adjacent to the second end of the line of the transfer electrodes 10 (the first holding electrode 10A is arranged adjacent to the transfer electrode 10B). The second holding electrode 10 (10H) is positioned adjacent to the first end of the line of the transfer electrodes 10 (the second holding electrode 10H is arranged adjacent to the transfer electrode 10G). The transfer process includes the first transfer process and the second transfer process. The applied voltage control unit 5 is configured to, in the first transfer process, switch the voltage applied to the transfer electrode 10 from the control voltage to the reference voltage in order from the first end (the transfer electrode 10F) to the second end (the transfer electrode 10B) of the line of the transfer electrodes 10 based on the clock signal so as to transfer the electric charges 12 to the holding region corresponding to the first holding electrode 10A. The applied voltage control unit 5 is configured to, in the second transfer process, switch the voltage applied to the transfer electrode 10 from the control voltage to the reference voltage in order from the second end (the transfer electrode 10C) to the first end (the transfer electrode 10G) of the line of the transfer electrodes 10 based on the clock signal so as to transfer the electric charges 12 to the holding region corresponding to the second holding electrode 10H.

Further, in the driving device of the present embodiment, the applied voltage control unit 5 may delay the timings of applying the control voltages to the respective electrodes 10 by time shorter than the period of the clock signal in the process of transferring the accumulated electric charges 12 to the holding region, and apply the control voltages to the electrodes 10 simultaneously when the state is switched from the state of holding the electric charges in the holding region to the state of accumulating electric charges. In other words, the control circuit 250 is configured to adjust values of the driving signals given to the respective transfer electrodes 10 to the first value simultaneously in response to completion of the transfer process.

Further, in the driving device of the present embodiment, the applied voltage control unit 5 may keep the time interval between the timings of applying the control voltages to the respective electrodes 10 constant. In other words, the control circuit is configured to keep the predetermined time constant irrespective of the number of times of output of the driving signal.

Alternatively, in the driving device of the present embodiment, the control circuit 250 may be configured to, in the process of decreasing the area of the potential well 11 with a lapse of time by decreasing the number of the electrodes 10 receiving the control voltages, increase the time interval of the timings of applying the control voltages to the respective electrodes 10 in accordance with a decrease in the number of the electrodes 10 receiving the control voltages. In other words, the control circuit 250 is configured to prolong the predetermined time on the basis of the number of times of output of the driving signal.

Further, in the driving device of the present embodiment, the applied voltage control unit 5 may include the plural delay elements. Each of the delay elements is configured to delay an input and then output the delayed input. One delay element has an output terminal connected to an input terminal of another delay element. Any one of the inputs of the delay elements is synchronized with the clock signal. The applied voltage control unit 5 determines timings for delaying the reference timing signals by use of the outputs of the respective delay circuits. In other words, the control circuit 250 includes the delay circuit 21, the synchronization circuit (phase comparison unit) 15, and the driving signal generation circuit 251. The delay circuit 21 is configured to generate the plural timing signals delayed by the predetermined time. The synchronization circuit 15 is configured to synchronize one of the plural timing signals with the clock signal. The driving signal generation circuit 251 is configured to generate the driving signals for the respective transfer electrodes 10 based on the plural timing signals. The delay circuit 21 includes the plural delay elements (NOT gates 22) connected circularly. Each delay element is configured to delay a signal inputted by constant time and output the resultant signal.

Further, in the driving device of the present embodiment, the applied voltage control unit 5 may include the phase comparison unit 29 and the timing adjustment unit 30. The phase comparison unit 29 is configured to measure the phase difference between the control voltages applied to the respective adjacent electrodes 10. The timing adjustment unit 30 is configured to adjust the timing of applying at least one of the control voltages so as to keep the phase difference constant. In other words, the control circuit 250 includes the phase comparison unit 29 and the timing adjustment unit 30. The phase comparison unit 29 is configured to measure the phase difference between the first driving signal (the driving signal associated with one of the adjacent transfer electrodes 10) and the second driving signal (the driving signal associated with the other of the adjacent transfer electrodes 10). The timing adjustment unit 30 is configured to adjust at least one of the phase of the first driving signal and the phase of the second driving signal such that the phase difference is identical to the predetermined value.

The spatial information detecting device using the driving device of the present embodiment includes the light emitting source 1, the imaging device, and the processing device. The light emitting source 1 is configured to emit light to the target space. The imaging device includes the imaging element 2. The imaging element 2 includes the charge-coupled device in which the plural electrodes 10 are arranged on (over) the surface of the device formation layer 13 made of a semiconductor, and is configured to image the target space. The processing device is configured to obtain the information of the target space with reference to a relation between light emitted from the light emitting source 1 and light received by the imaging device. The processing device includes the driving device configured to drive the imaging element 2. The driving device has a function of controlling the potential well formed in the device formation layer 13 in response to applying the control voltage to the electrode 10 so as to transfer the electric charges within the device formation layer 13. The driving device includes the clock generation unit 3 configured to generate the clock signal, and the applied voltage control unit 5 configured to vary the area of the potential well with regard to a plane parallel to the surface of the device formation layer 13 by controlling the timings at which the control voltages are applied to the respective adjacent electrodes 10 of the electrodes 10. The applied voltage control unit 5 is configured to delay the clock signal or the reference timing signal generated in synchronization with the clock signal so as to generate the control voltages applied to the adjacent electrodes at the different timings. The time interval between the control voltages applied to the adjacent electrodes is selected to be shorter than the period of the clock signal.

In other words, the aforementioned spatial information detecting device includes the light emitting source 1, the imaging device, and the processing device. The light emitting source 1 is configured to emit light to the target space. The imaging device is configured to receive light from the target space. The processing device is configured to create the information of the target space based on the relation between the light emitted from the light emitting source 1 and the light received by the imaging device. The imaging device includes the imaging element 2 including the charge generation unit and the charge-coupled device. The charge generation unit is configured to generate an amount of the electric charges corresponding to intensity of the light from the target space. The charge-coupled device is configured to transfer the electric charges generated by the charge generation unit. The imaging element 2 is a CCD image sensor, for example. The charge-coupled device includes the device formation layer 13, the electrically insulating layer 14, and the line of the transfer electrodes 10. The semiconductor layer 13 is doped with impurities. The electrically insulating layer 14 is formed on/over the semiconductor layer 13. The line of the transfer electrodes 10 is positioned on/over the electrically insulating layer 14 for forming the potential well within the semiconductor layer 13. The processing device includes the driving device for controlling the charge-coupled device to transfer the electric charges 12 generated by the charge generation unit. The driving device includes the clock generation unit 3 and the applied voltage control unit 5. The clock generation unit 3 is configured to output the clock signal. The applied voltage control unit 5 configured to perform the transfer process of switching the voltage applied to the transfer electrode 10 from the control voltage for forming the potential well to the reference voltage for eliminating the potential well in order from the first end to the second end (the transfer electrode 10F to the transfer electrode 10B) of the line of the transfer electrodes 10 based on the clock signal. The applied voltage control unit 5 includes the control circuit 250 and the driving circuit 280. The control circuit 250 is configured to create the driving signal defined as the binary signal having the first value and the second value for each transfer electrode 10 and output the created driving signal. The driving circuit 280 is configured to, upon receiving the driving signal, apply the control voltage to the transfer electrode 10 associated with the received driving signal when the received driving signal has the first value, and apply the reference voltage to the transfer electrode 10 associated with the received driving signal when the received driving signal has the second value. The control circuit 250 is configured to, in the transfer process, delay the second driving signal defined by the driving signal associated with one of the adjacent transfer electrodes 10 from the first driving signal defined by the driving signal associated with the other of the adjacent transfer electrodes 10 so as to adjust the phase difference between the first driving signal and the second driving signal to the value corresponding to the predetermined time shorter than the period of the clock signal.

According to the spatial information detecting device, the spatial information detecting device generates the control voltages applied to the adjacent electrodes at the different timings by means of delaying the clock signal or the reference timing signal generated in synchronization with the clock signal. Further, the spatial information detecting device shortens the time defining a delay of the control voltage applied to each electrode than the period of the clock signal. Consequently, it is possible to shorten the time which it takes for moving the electric charges from the potential well formed over the region associated with the plural electrodes to the potential well over the region associated with the fewer electrodes.

Therefore, the transfer period of electric charges within the charge-coupled device can be shortened without shortening the period of the clock signal.

The invention claimed is:

1. A driving device for controlling a charge-coupled device to transfer electric charges, said charge-coupled device comprising a semiconductor layer doped with impurities, an electrically insulating layer formed on/over said semiconductor layer, and a line of transfer electrodes positioned on/over said electrically insulating layer for forming a potential well within said semiconductor layer, and said driving device comprising:

a clock generation unit configured to output a clock signal; and an applied voltage control unit configured to perform a transfer process of switching a voltage applied to said transfer electrode from a control voltage for forming the potential well to a reference voltage for eliminating the potential well in order from a first end to a second end of the line of said transfer electrodes based on the clock signal, wherein said applied voltage control unit comprises:

a control circuit configured to create a driving signal defined as a binary signal having a first value and a second value for each transfer electrode and output the created driving signal; and a driving circuit configured to, upon receiving the driving signal, apply the control voltage to said transfer electrode associated with the received driving signal when the received driving signal has the first value, and apply the reference voltage to said transfer electrode associated with the received driving signal when the received driving signal has the second value, and said control circuit is configured to, in the transfer process, delay a second driving signal defined by said driving signal associated with one of said adjacent transfer electrodes from a first driving signal defined by said driving signal associated with the other of said adjacent transfer electrodes so as to adjust a phase difference between said first driving signal and said second driving signal to a value corresponding to predetermined time shorter than a period of said clock signal.

2. A driving device as set forth in claim 1, wherein
said charge-coupled device comprises a holding electrode positioned on/over said electrically insulating layer for generating, in said semiconductor layer, a potential well serving as a holding region for holding electric charges transferred by said driving device, and
said holding electrode is positioned adjacent to the second end of the line of said transfer electrodes, and
said applied voltage control unit is configured to, in the transfer process, switch the voltage applied to said transfer electrode from the control voltage to the reference voltage in order from the first end to the second end of the line of said transfer electrodes based on the clock signal so as to transfer the electric charges to said holding region.

3. A driving device as set forth in claim 1, wherein
said charge-coupled device comprises first and second holding electrodes positioned on/over said electrically insulating layer for generating, in said semiconductor layer, potential wells each serving as a holding region for holding electric charges transferred by said driving device, and
said first holding electrode is positioned adjacent to the second end of the line of said transfer electrodes, and
said second holding electrode is positioned adjacent to the first end of the line of said transfer electrodes, and
the transfer process comprises a first transfer process and a second transfer process, and
said applied voltage control unit is configured to, in the first transfer process, switch the voltage applied to said transfer electrode from the control voltage to the reference voltage in order from the first end to the second end of the line of said transfer electrodes based on the clock signal so as to transfer the electric charges to said holding region corresponding to said first holding electrode, and
said applied voltage control unit is configured to, in the second transfer process, switch the voltage applied to said transfer electrode from the control voltage to the reference voltage in order from the second end to the first end of the line of said transfer electrodes based on the clock signal so as to transfer the electric charges to said holding region corresponding to said second holding electrode.

4. A driving device as set forth in claim 2, wherein
said control circuit is configured to adjust values of said driving signals given to said respective transfer electrodes to the first value simultaneously in response to completion of the transfer process.

5. A driving device as set forth in claim 1, wherein
said control circuit is configured to keep the predetermined time constant irrespective of the number of times of output of said driving signal.

6. A driving device as set forth in claim 1, wherein
said control circuit is configured to prolong the predetermined time on the basis of the number of times of output of said driving signal.

7. A driving device as set forth in claim 1, wherein
said control circuit comprises:
a delay circuit configured to generate plural timing signals delayed by the predetermined time;
a synchronization circuit configured to synchronize one of said plural timing signals with said clock signal; and
a driving signal generation circuit configured to generate said driving signals for said respective transfer electrodes based on said plural timing signals, and
said delay circuit comprises plural delay elements connected circularly, and
each delay element is configured to delay a signal inputted by constant time and output the resultant signal.

8. A driving device as set forth in claim 1, wherein said control circuit comprises:
a phase comparison unit configured to measure a phase difference between said first driving signal and said second driving signal; and
a timing adjustment unit configured to adjust at least one of a phase of said first driving signal and a phase of said second driving signal such that the phase difference is identical to a predetermined value.

9. A spatial information detecting device comprising:
a light emitting source configured to emit light to a target space;
an imaging device configured to receive light from the target space; and
a processing device configured to create information of the target space based on a relation between the light emitted from said light emitting source and the light received by said imaging device,
wherein said imaging device comprises:
a charge generation unit configured to generate an amount of electric charges corresponding to intensity of the light from the target space; and
a charge-coupled device configured to transfer the electric charges generated by said charge generation unit, and
said charge-coupled device comprises:
a semiconductor layer doped with impurities;
an electrically insulating layer formed on/over said semiconductor layer; and
a line of transfer electrodes positioned on/over said electrically insulating layer for forming a potential well within said semiconductor layer, and
said processing device comprises a driving device for controlling said charge-coupled device to transfer the electric charges generated by said charge generation unit, and
said driving device comprising:
a clock generation unit configured to output a clock signal; and
an applied voltage control unit configured to perform a transfer process of switching a voltage applied to said transfer electrode from a control voltage for forming the potential well to a reference voltage for eliminating the potential well in order from a first end to a second end of the line of said transfer electrodes based on the clock signal,
wherein said applied voltage control unit comprises:
a control circuit configured to create a driving signal defined as a binary signal having a first value and a second value for each transfer electrode and output the created driving signal; and
a driving circuit configured to, upon receiving the driving signal, apply the control voltage to said transfer electrode associated with the received driving signal when the received driving signal has the first value, and apply the reference voltage to said transfer electrode associated with the received driving signal when the received driving signal has the second value, and said control circuit is configured to, in the transfer process, delay a second driving signal defined by said driving signal associated with one of said adjacent transfer electrodes from a first driving signal defined by said driving signal associated with the other of said adjacent transfer electrodes so as to adjust a phase difference between said first driving signal and said second driving signal to a value corresponding to predetermined time shorter than a period of said clock signal.

* * * * *